United States Patent
Atwater et al.

(10) Patent No.: US 9,691,921 B2
(45) Date of Patent: Jun. 27, 2017

(54) TEXTURED METALLIC BACK REFLECTOR

(75) Inventors: Harry Atwater, South Pasadena, CA (US); Brendan Kayes, Santa Clara, CA (US); Isik C. Kizilyalli, San Francisco, CA (US); Hui Nie, Santa Clara, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 699 days.

(21) Appl. No.: 12/904,047

(22) Filed: Oct. 13, 2010

(65) Prior Publication Data

US 2011/0083722 A1    Apr. 14, 2011

Related U.S. Application Data

(60) Provisional application No. 61/251,681, filed on Oct. 14, 2009, provisional application No. 61/251,684, filed on Oct. 14, 2009.

(51) Int. Cl.
*H01L 31/00* (2006.01)
*H01L 21/00* (2006.01)
(Continued)

(52) U.S. Cl.
CPC .... *H01L 31/02327* (2013.01); *H01L 31/0236* (2013.01); *H01L 31/02366* (2013.01);
(Continued)

(58) Field of Classification Search
CPC ........... H01L 31/02327; H01L 31/0236; H01L 31/0693; H01L 31/02366; H01L 31/0527;
(Continued)

(56) References Cited

U.S. PATENT DOCUMENTS 3,615,853 A    10/1971 Paine et al.
3,990,101 A    11/1976 Ettenberg et al.
(Continued)

FOREIGN PATENT DOCUMENTS

EP    0595634 A1    5/1994
JP    63-211775    9/1988
(Continued)

OTHER PUBLICATIONS

Nielson et al. "Microfabrication of microsystem-enabled photovoltaic (MEPV) cells." Proceedings of the International Society of Optics and Photonics (SPIE) [online], (Jan. 25, 2011) Retreived from the internet: <URL: http://photovoltaics.sandia.gov/Pubs_2010/2011/Microfab_of_MEPV_Cells_SPIE_2011.pdf> See entire document especially Figure 5, p. 5.
(Continued)

*Primary Examiner* — Lindsey Bernier
(74) *Attorney, Agent, or Firm* — Arent Fox LLP

(57) ABSTRACT

Embodiments of the invention generally relate to device fabrication of thin films used as solar devices or other electronic devices, and include textured back reflectors utilized in solar applications. In one embodiment, a method for forming a textured metallic back reflector which includes depositing a metallic layer on a gallium arsenide material within a thin film stack, forming an array of metallic islands from the metallic layer during an annealing process, removing or etching material from the gallium arsenide material to form apertures between the metallic islands, and depositing a metallic reflector layer to fill the apertures and cover the metallic islands. In another embodiment, a textured metallic back reflector includes an array of metallic islands disposed on a gallium arsenide material, a plurality of apertures disposed between the metallic islands and extending into the gallium arsenide material, a metallic reflector layer disposed (Continued)

over the metallic islands, and a plurality of reflector protrusions formed between the metallic islands and extending from the metallic reflector layer and into the apertures formed in the gallium arsenide material.

40 Claims, 17 Drawing Sheets

(51) Int. Cl.
  H01L 31/0232 (2014.01)
  H01L 31/056 (2014.01)
  H01L 31/0304 (2006.01)
  H01L 31/0236 (2006.01)
  H01L 31/18 (2006.01)
  H01L 31/20 (2006.01)
  H01L 31/0693 (2012.01)

(52) U.S. Cl.
  CPC .... *H01L 31/0304* (2013.01); *H01L 31/03046* (2013.01); *H01L 31/056* (2014.12); *H01L 31/0693* (2013.01); *H01L 31/18* (2013.01); *H01L 31/184* (2013.01); *H01L 31/1844* (2013.01); *H01L 31/1852* (2013.01); *H01L 31/208* (2013.01); *Y02E 10/50* (2013.01); *Y02E 10/544* (2013.01)

(58) Field of Classification Search
  CPC ........... H01L 31/0304; H01L 31/03046; H01L 31/056; H01L 31/18; H01L 31/184; H01L 31/1844; H01L 31/1852; H01L 31/208; Y02E 10/544; Y02E 10/50
  USPC ....... 136/244, 246, 252, 256, 259, 262, 265, 136/255; 438/57, 71
  See application file for complete search history.

(56) References Cited

U.S. PATENT DOCUMENTS

| | | |
|---|---|---|
| 4,015,280 A | 3/1977 | Matsushita et al. |
| 4,017,332 A | 4/1977 | James |
| 4,107,723 A | 8/1978 | Kamath |
| 4,191,593 A | 3/1980 | Cacheux |
| 4,197,141 A | 4/1980 | Bozler et al. |
| 4,338,480 A | 7/1982 | Antypas et al. |
| 4,385,198 A | 5/1983 | Rahilly |
| 4,400,221 A | 8/1983 | Rahilly |
| 4,410,758 A | 10/1983 | Grolitzer |
| 4,419,533 A | 12/1983 | Czubatyj et al. |
| 4,444,992 A | 4/1984 | Cox, III |
| 4,479,027 A | 10/1984 | Todorof |
| 4,497,974 A | 2/1985 | Deckman et al. |
| 4,543,441 A | 9/1985 | Kumada et al. |
| 4,571,448 A | 2/1986 | Barnett |
| 4,582,952 A | 4/1986 | McNeely et al. |
| 4,633,030 A | 12/1986 | Cook |
| 4,667,059 A | 5/1987 | Olson |
| 4,773,945 A | 9/1988 | Woolf et al. |
| 4,775,639 A * | 10/1988 | Yoshida .................... 438/94 |
| 4,889,656 A | 12/1989 | Flynn et al. |
| 4,916,503 A | 4/1990 | Uematsu et al. |
| 4,989,059 A | 1/1991 | Micheels et al. |
| 4,997,491 A | 3/1991 | Hokuyo et al. |
| 5,101,260 A * | 3/1992 | Nath et al. ................ 257/53 |
| 5,103,268 A * | 4/1992 | Yin et al. .................. 257/750 |
| 5,116,427 A | 5/1992 | Fan et al. |
| 5,136,351 A | 8/1992 | Inoue et al. |
| 5,217,539 A | 6/1993 | Fraas et al. |
| 5,223,043 A | 6/1993 | Olson et al. |
| 5,230,746 A * | 7/1993 | Wiedeman ............ H01L 31/075 136/249 |
| 5,316,593 A | 5/1994 | Olson et al. |
| 5,330,585 A | 7/1994 | Chang et al. |
| 5,342,453 A | 8/1994 | Olson |
| 5,356,488 A | 10/1994 | Hezel |
| 5,376,185 A | 12/1994 | Wanlass |
| 5,385,960 A | 1/1995 | Emmons et al. |
| 5,465,009 A | 11/1995 | Drabik et al. |
| 5,468,652 A | 11/1995 | Gee |
| 6,107,563 A | 8/2000 | Nakanishi et al. |
| 6,166,218 A | 12/2000 | Ravichandran |
| 6,166,318 A | 12/2000 | Freeouf |
| 6,229,084 B1 | 5/2001 | Katsu |
| 6,231,931 B1 | 5/2001 | Blazey et al. |
| 6,255,580 B1 | 7/2001 | Karam et al. |
| 6,372,981 B1 | 4/2002 | Ueda et al. |
| 6,534,336 B1 | 3/2003 | Iwane et al. |
| 6,617,508 B2 | 9/2003 | Kilmer et al. |
| 7,038,250 B2 | 5/2006 | Sugiyama et al. |
| 7,875,945 B2 | 1/2011 | Krasnov et al. |
| 8,183,081 B2 | 5/2012 | Weidman et al. |
| 8,258,596 B2 | 9/2012 | Nasuno et al. |
| 8,664,515 B2 | 3/2014 | Hong et al. |
| 8,697,553 B2 | 4/2014 | Adibi et al. |
| 8,993,873 B2 | 3/2015 | Youtsey et al. |
| 9,099,595 B2 | 8/2015 | King et al. |
| 2001/0027805 A1 | 10/2001 | Ho et al. |
| 2002/0000244 A1 | 1/2002 | Zaidi |
| 2002/0053683 A1 | 5/2002 | Hill et al. |
| 2002/0144724 A1 | 10/2002 | Kilmer et al. |
| 2002/0179141 A1 | 12/2002 | Ho et al. |
| 2003/0140962 A1 | 7/2003 | Sharps et al. |
| 2003/0222278 A1 | 12/2003 | Liu et al. |
| 2004/0112426 A1 | 6/2004 | Hagino |
| 2004/0166681 A1 | 8/2004 | Iles et al. |
| 2004/0200523 A1 | 10/2004 | King et al. |
| 2005/0022863 A1 * | 2/2005 | Agostinelli ....... H01L 31/02167 136/256 |
| 2006/0081963 A1 | 4/2006 | Rehder et al. |
| 2006/0090790 A1 | 5/2006 | Kobayashi et al. |
| 2006/0144435 A1 | 7/2006 | Wanlass |
| 2006/0162767 A1 | 7/2006 | Mascarenhas et al. |
| 2006/0207651 A1 | 9/2006 | Posthuma et al. |
| 2006/0255340 A1 | 11/2006 | Manivannan et al. |
| 2007/0131275 A1 | 6/2007 | Kinsey et al. |
| 2007/0137695 A1 | 6/2007 | Fetzer et al. |
| 2007/0137698 A1 | 6/2007 | Wanlass et al. |
| 2007/0151596 A1 | 7/2007 | Nasuno et al. |
| 2007/0166862 A1 | 7/2007 | Kim et al. |
| 2007/0199591 A1 * | 8/2007 | Harder et al. ................. 136/252 |
| 2007/0235074 A1 | 10/2007 | Henley et al. |
| 2007/0277874 A1 | 12/2007 | Dawson-Elli et al. |
| 2008/0128020 A1 * | 6/2008 | Zafar et al. ................... 136/252 |
| 2008/0245409 A1 | 10/2008 | Varghese et al. |
| 2009/0151784 A1 | 6/2009 | Luan et al. |
| 2009/0283802 A1 | 11/2009 | Henderson et al. |
| 2010/0006143 A1 | 1/2010 | Welser |
| 2010/0015751 A1 | 1/2010 | Weidman et al. |
| 2010/0055397 A1 | 3/2010 | Kurihara et al. |
| 2010/0065117 A1 | 3/2010 | Kim et al. |
| 2010/0089443 A1 | 4/2010 | Bloomstein et al. |
| 2010/0096010 A1 | 4/2010 | Welser |
| 2010/0126552 A1 | 5/2010 | Kizilyalli et al. |
| 2010/0126570 A1 | 5/2010 | Kizilyalli et al. |
| 2010/0126571 A1 | 5/2010 | Kizilyalli et al. |
| 2010/0126572 A1 | 5/2010 | Kizilyalli et al. |
| 2010/0132774 A1 | 6/2010 | Borden |
| 2010/0132780 A1 | 6/2010 | Kizilyalli et al. |
| 2010/0193002 A1 | 8/2010 | Dimroth et al. |
| 2010/0294356 A1 | 11/2010 | Parikh et al. |
| 2011/0083722 A1 | 4/2011 | Atwater et al. |
| 2011/0088771 A1 | 4/2011 | Lin et al. |
| 2011/0108098 A1 | 5/2011 | Kapur |
| 2011/0156000 A1 | 6/2011 | Cheng |
| 2011/0214728 A1 | 9/2011 | Veerasamy |
| 2011/0244692 A1 | 10/2011 | Jeong et al. |
| 2011/0290322 A1 | 12/2011 | Meguro et al. |
| 2012/0024336 A1 | 2/2012 | Hwang |
| 2012/0031478 A1 | 2/2012 | Boisvert et al. |
| 2012/0055541 A1 | 3/2012 | Granek et al. |
| 2012/0067423 A1 | 3/2012 | Lochtefeld et al. |

(56) References Cited

U.S. PATENT DOCUMENTS

| | | |
|---|---|---|
| 2012/0104411 A1 | 5/2012 | Iza et al. |
| 2012/0125256 A1 | 5/2012 | Kramer et al. |
| 2012/0132930 A1 | 5/2012 | Young et al. |
| 2012/0160296 A1 | 6/2012 | Laparra et al. |
| 2012/0164796 A1 | 6/2012 | Lowenthal et al. |
| 2012/0227805 A1 | 9/2012 | Hermle et al. |
| 2012/0305059 A1 | 12/2012 | Kayes et al. |
| 2013/0026481 A1 | 1/2013 | Xu et al. |
| 2013/0112258 A1 | 5/2013 | Park et al. |
| 2013/0220396 A1 | 8/2013 | Janssen et al. |
| 2013/0288418 A1 | 10/2013 | Wang et al. |
| 2014/0076386 A1 | 3/2014 | King et al. |
| 2014/0261611 A1 | 9/2014 | King et al. |
| 2014/0312373 A1 | 10/2014 | Donofrio |
| 2015/0171261 A1 | 6/2015 | Domine |

FOREIGN PATENT DOCUMENTS

| | | |
|---|---|---|
| JP | 3-285368 | 12/1991 |
| JP | 06-244443 | 9/1994 |
| JP | 07-007148 | 1/1995 |
| JP | 8-130321 | 5/1996 |
| JP | H-09-213206 A | 8/1997 |
| KR | 10-0762772 | 10/2007 |
| WO | WO02065553 A1 | 8/2002 |
| WO | 2008100603 A1 | 8/2008 |
| WO | WO 2016/123074 A1 | 8/2016 |

OTHER PUBLICATIONS

Van Wijngaarden et al. "Direct Imaging of Propagation and Damping of Near-Resonance Surface Plasmon Polaritons using Cathodoluminescence Spectroscopy" (Jun. 1, 2006) Appl. Phys. Lett. 88, 221111, pp. 1-3.

Pacifici et al. "Quantitative Determination of Optical Transmission through Subwavelength Slit Arrays in Ag films: The Essential role of Surface Wave Interference and Local Coupling between Adjacent Slits" (Oct. 22, 2007) Thomas J. Watson Lab. of Appl. Phys., pp. 1-4.

Park et al. "Surface Plasmon Enhanced Photoluminescence of Conjugated Polymers" (Apr. 17, 2007) Appl. Phys. Letters 90, 161107, pp. 1-3.

Tanabe et al. "Direct-bonded GaAs/InGaAs Tandem Solar Cell" (Sep. 6, 2006) Appl. Phys. Lett. 89, 102106, pp. 1-3.

Dionne et al. "Highly Confined Photon Transport in Subwavelength Metallic Slot Waveguides" (Jun. 20, 2006) Nano Lett., vol. 6, No. 9, pp. 1928-1932.

Biteen et al. "Spectral Tuning of Plasmon-enhanced Silicon Quantum Dot Luminescence" (Mar. 31, 2006) Applied Physics Letters 88, 131109, pp. 1-3.

Aisaka et al. "Enhancement of upconversion Luminescence of Er Doped Al2O3 Films by Ag Islands Films" (Apr. 1, 2008) Applied Physics Letters 92, 132105, pp. 1-3.

Lezec et al. "Negative Refraction at Visible Frequencies" (Apr. 20, 2007) Science, vol. 316, pp. 430-432.

Pillai et al. "Enhanced emission from Si-based Light-emitting Diodes using Surface Plasmons" (Apr. 17, 2006) Applied Physics Letters, 88, 161102, pp. 1-3.

"Volmer-Weber and Stranski-Krastanov InAs._As quantum dots emitting at 1.3um" by Tsatsul'nikov et al., Journal of Applied Physics, vol. 88, No. 11, Dec. 1, 2000.

"The Stranski—Krastanov Three Dimensional Island Growth Prediction on Finite Size Model" to Othaman et al., 2008.

M. M. Sanfacon et al, "Analysis of AlGaAs/GaAs Solar Cell Structures by Optical Reflectance Spectroscopy" IEEE Transactions on Electron Devices, vol. 37, No. 2, Feb. 1990, pp. 450-454.

Q. M. Zhang et al, "Effects of Displaced p-n Junction of Heterojunction Bipolar Transistors", IEEE Transactions on Electron Devices, vol. 39, No. 11, Nov. 1992, pp. 2430-2437.

Peter A. Lewis, "Pigment Handbook vol. I: Properties and Economics, 2nd Edition", John Wiley & Sons, New York, pp. 790-791 (1988).

B. H. Floyd, et al., "AN N-AlGaAs P-GaAs Graded Heterojunction for High Concentration Ratios," pp. 81-86, IEEE, 1987.

Hiroshi Yamaguchi, et al., "Development Status of "Space Solar Sheet"", IEEE PVSC Proceedings, 2008.

Tatsuya Takamoto, et al., "Paper-Thin InGaP/GaAs Solar Cells", IEEE PVSC Proceedings, pp. 1769-1772, 2006.

International Search Report dated Dec. 2, 2016 issued in International Patent Application No. PCT/US2016/052939.

Kang et al., "Ultra-thin Film Nano-structured Gallium Arsenide Solar Cells," Proc. of SPIE, vol. 9277, No. 927718, pp. 1-7, 2014.

McPheeters et al., "Computational analysis of thin film InGaAs/GaAs quantum well solar cells with back side light trapping structures," Optics Express, vol. 20, No. S6, pp. A864-A878 (Nov. 5, 2012).

Mellor et al., "A numerical study of Bi-periodic binary diffraction gratings for solar cell applications," Solar Energy Materials & Solar Cells 95 (2011) 3527-3535.

Yang et al., "Ultra-Thin GaAs Single-Junction Solar Cells Integrated with an AlInP Layer for Reflective Back Scattering," (4 total pages), 2013.

\* cited by examiner

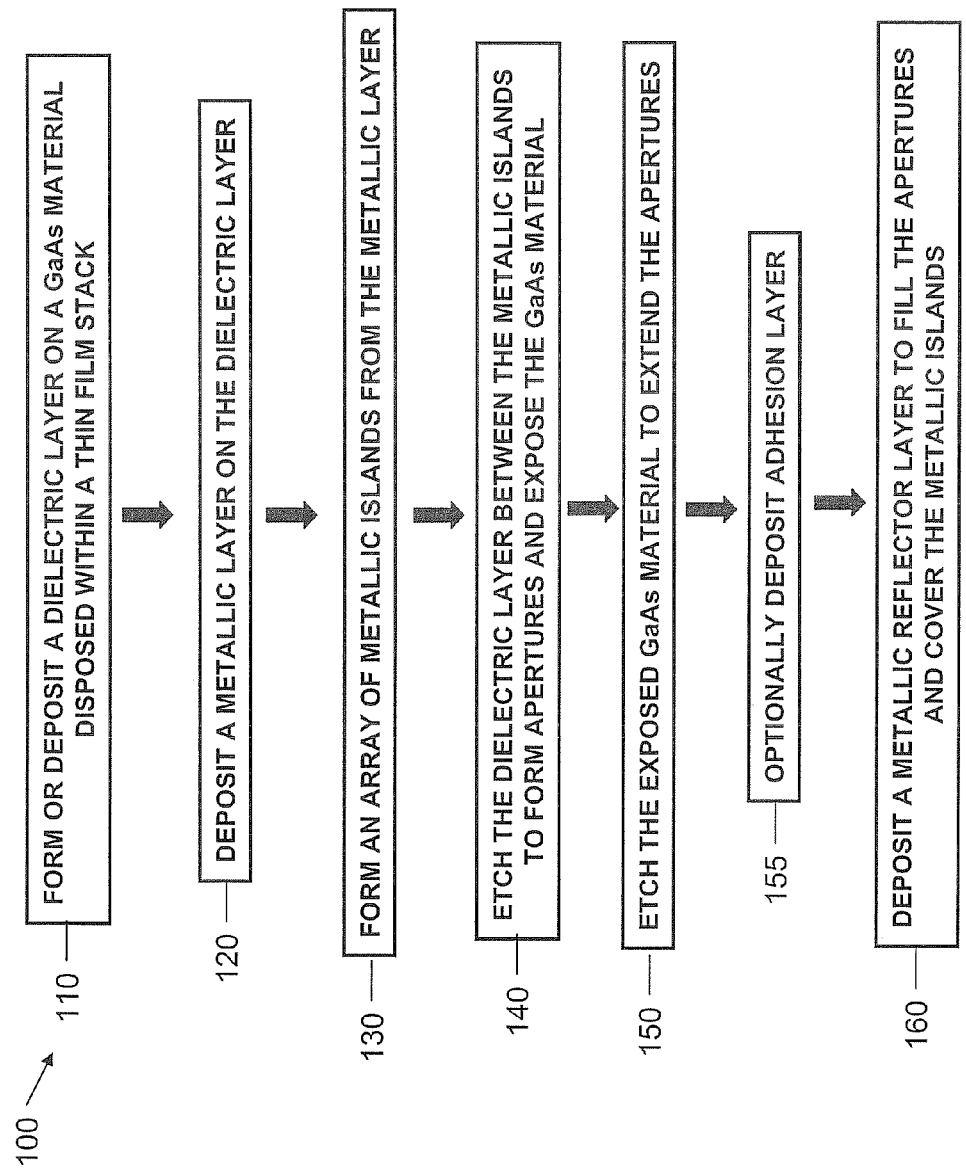

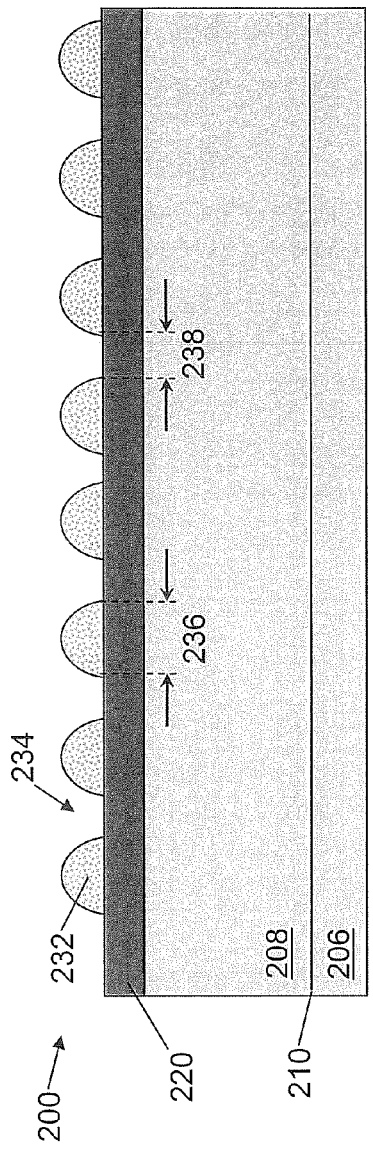
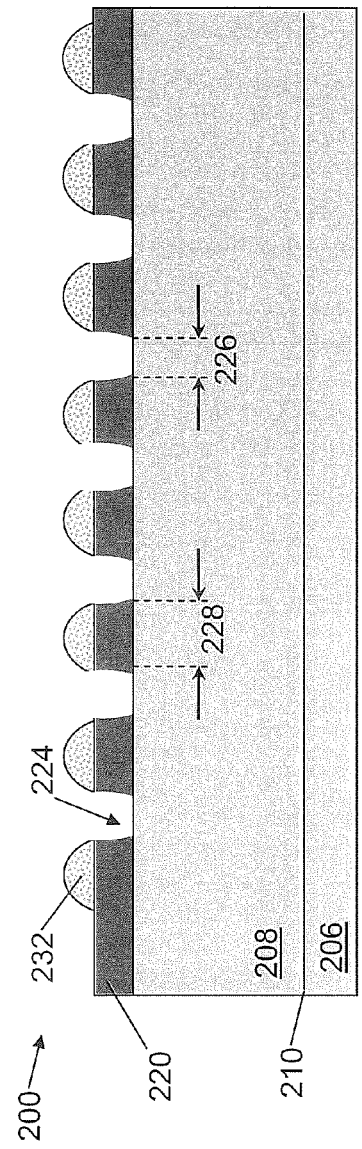
Fig. 2D
Fig. 2E

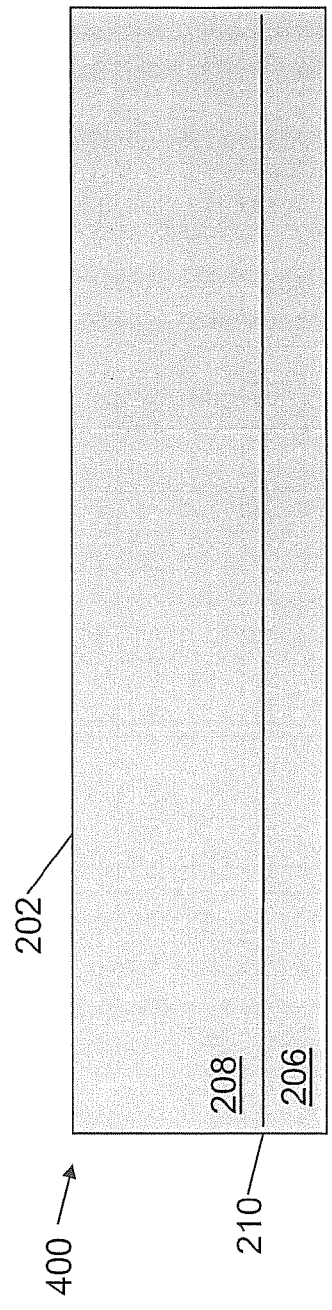
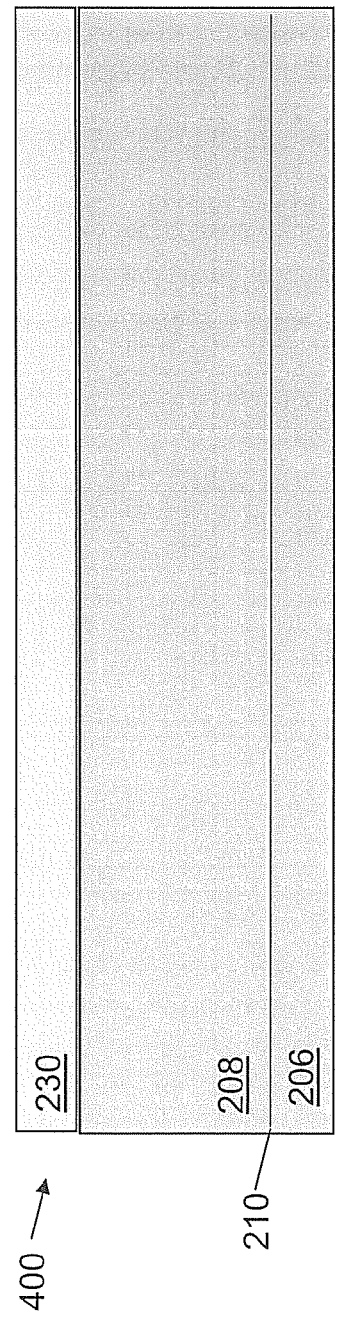
Fig. 4A
Fig. 4B

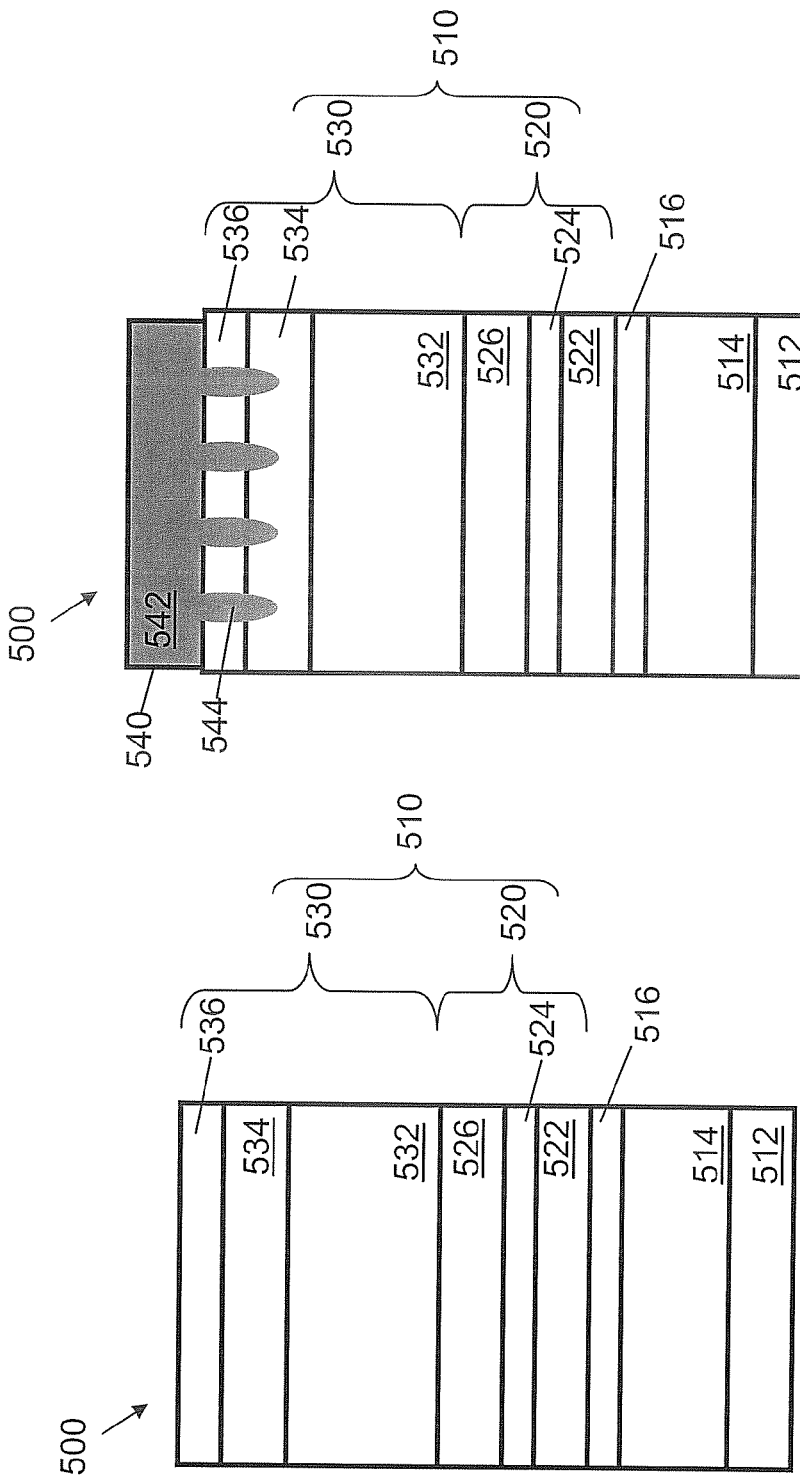

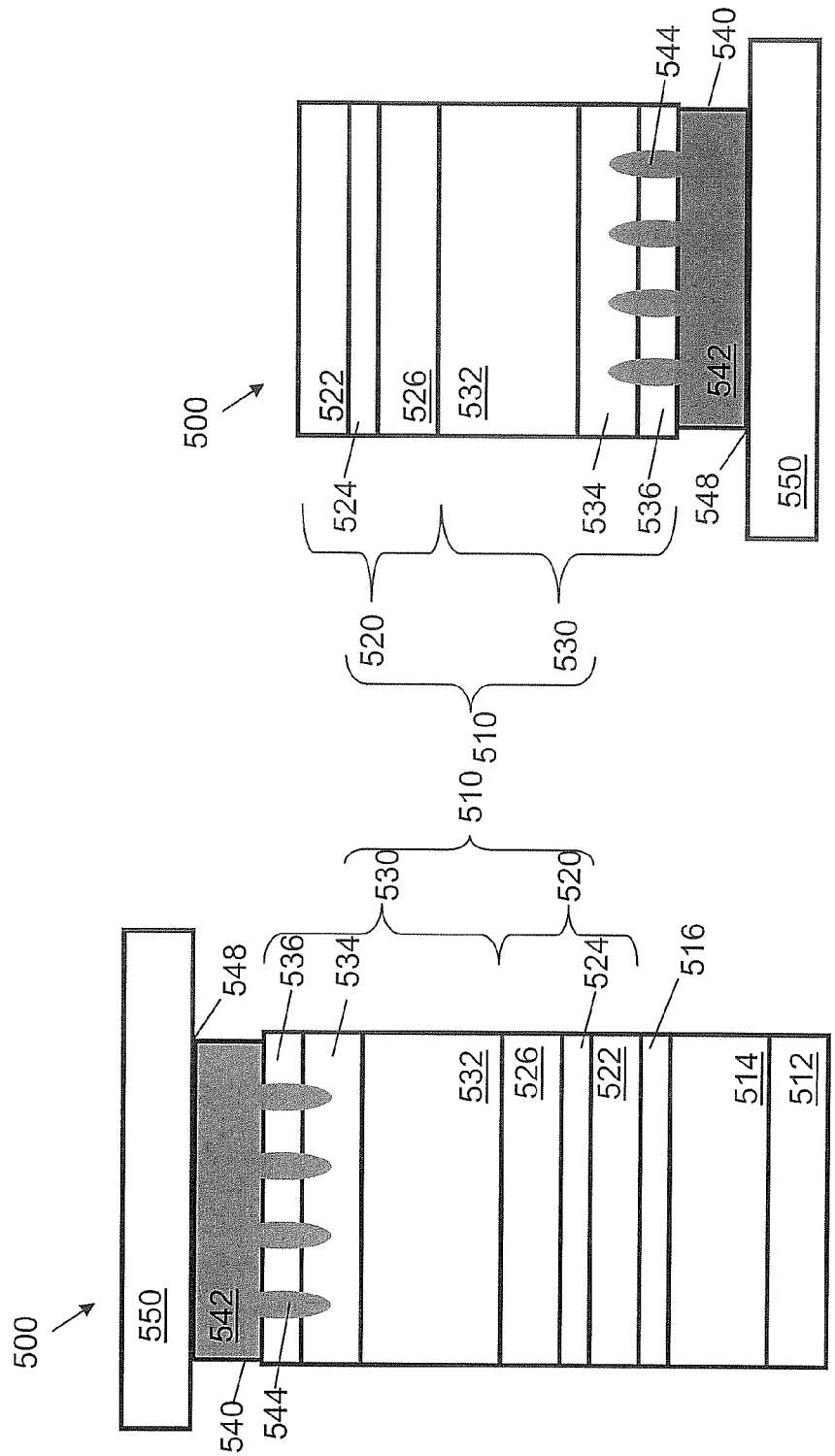

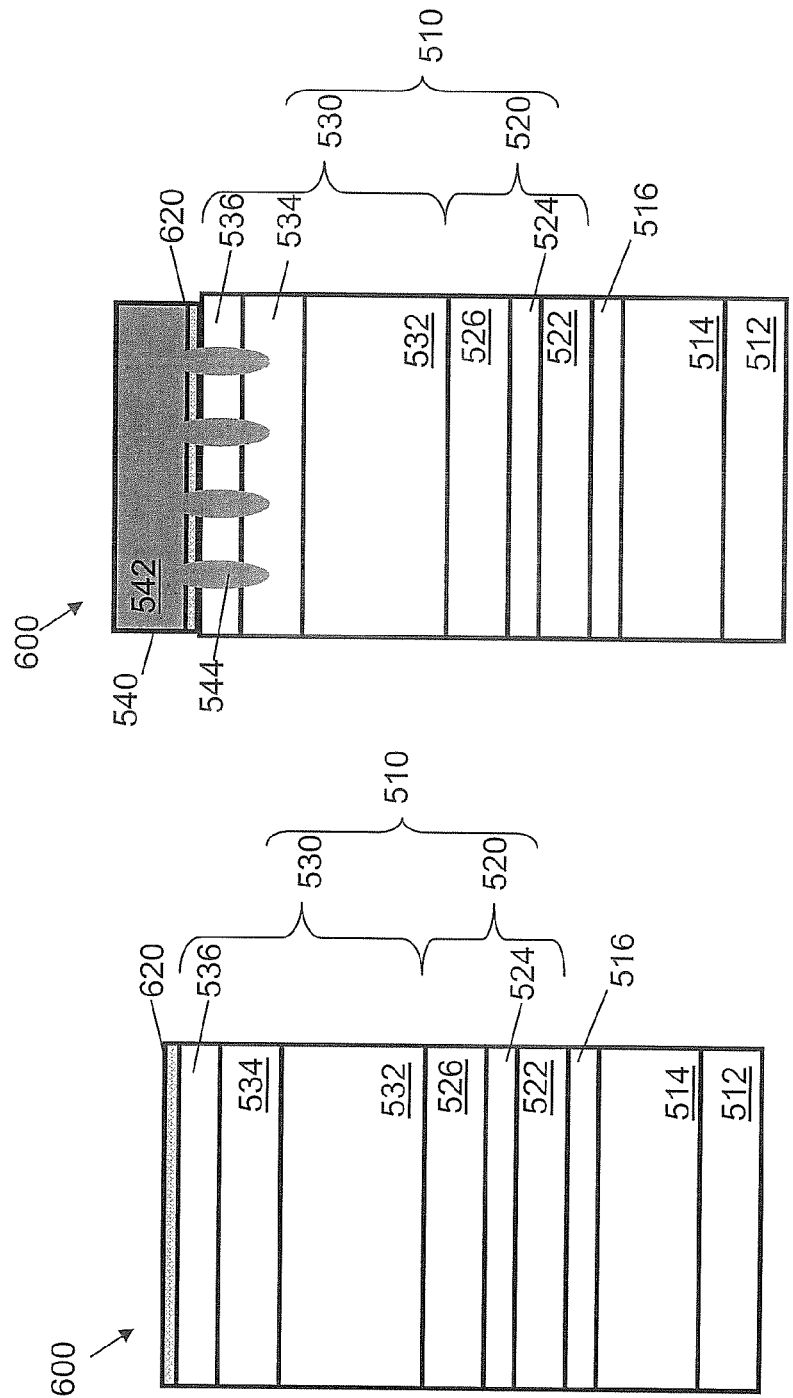

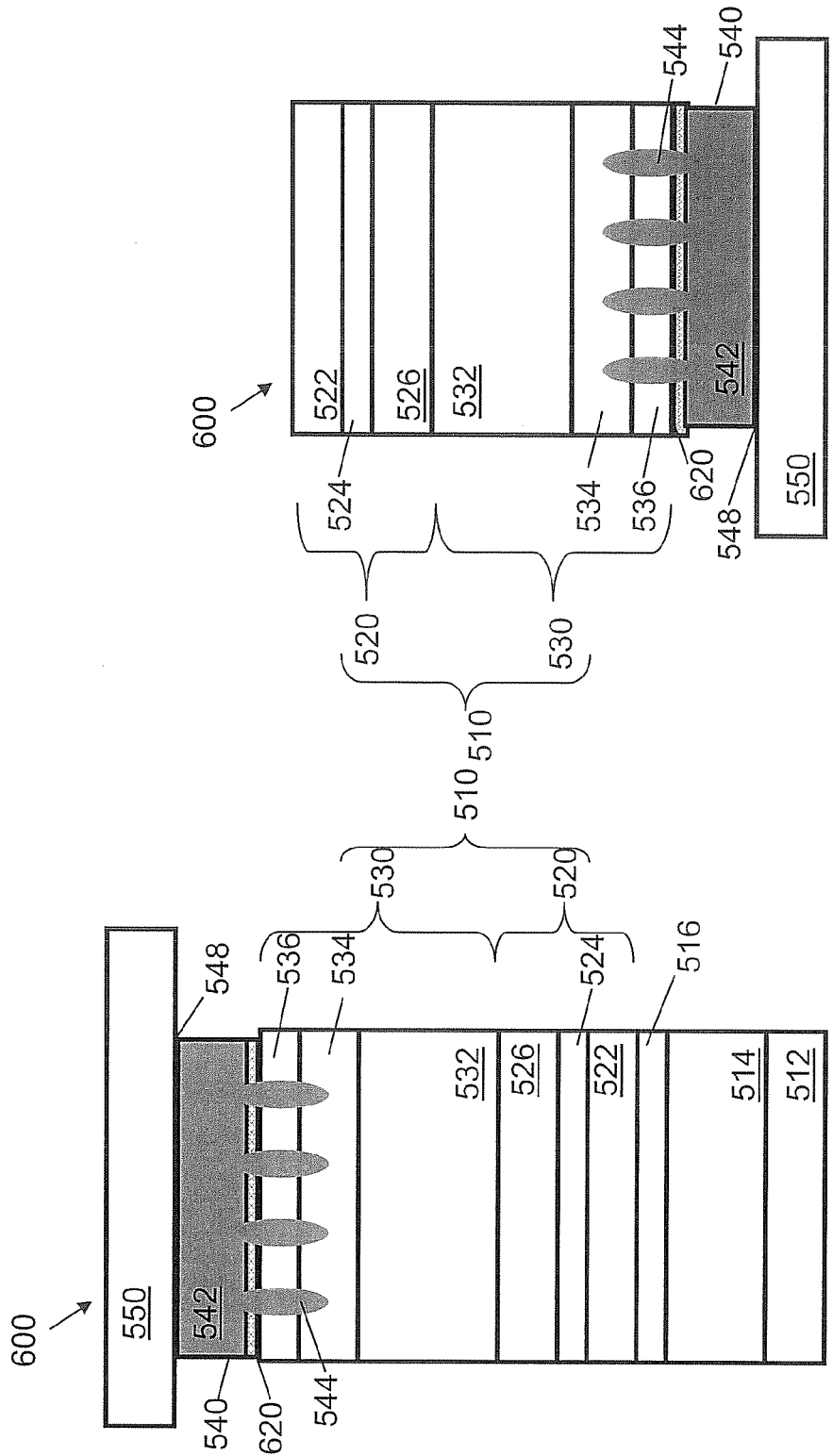

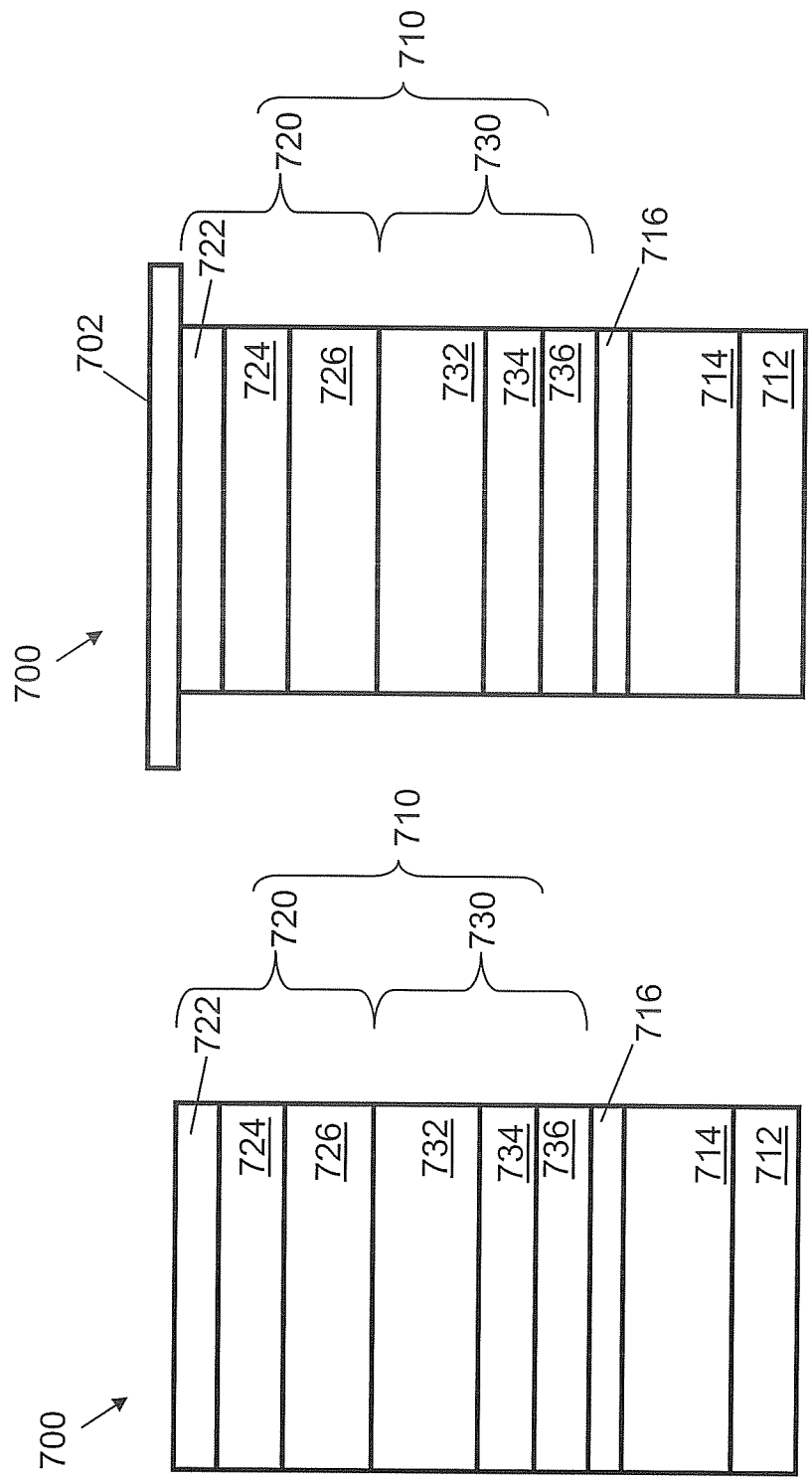

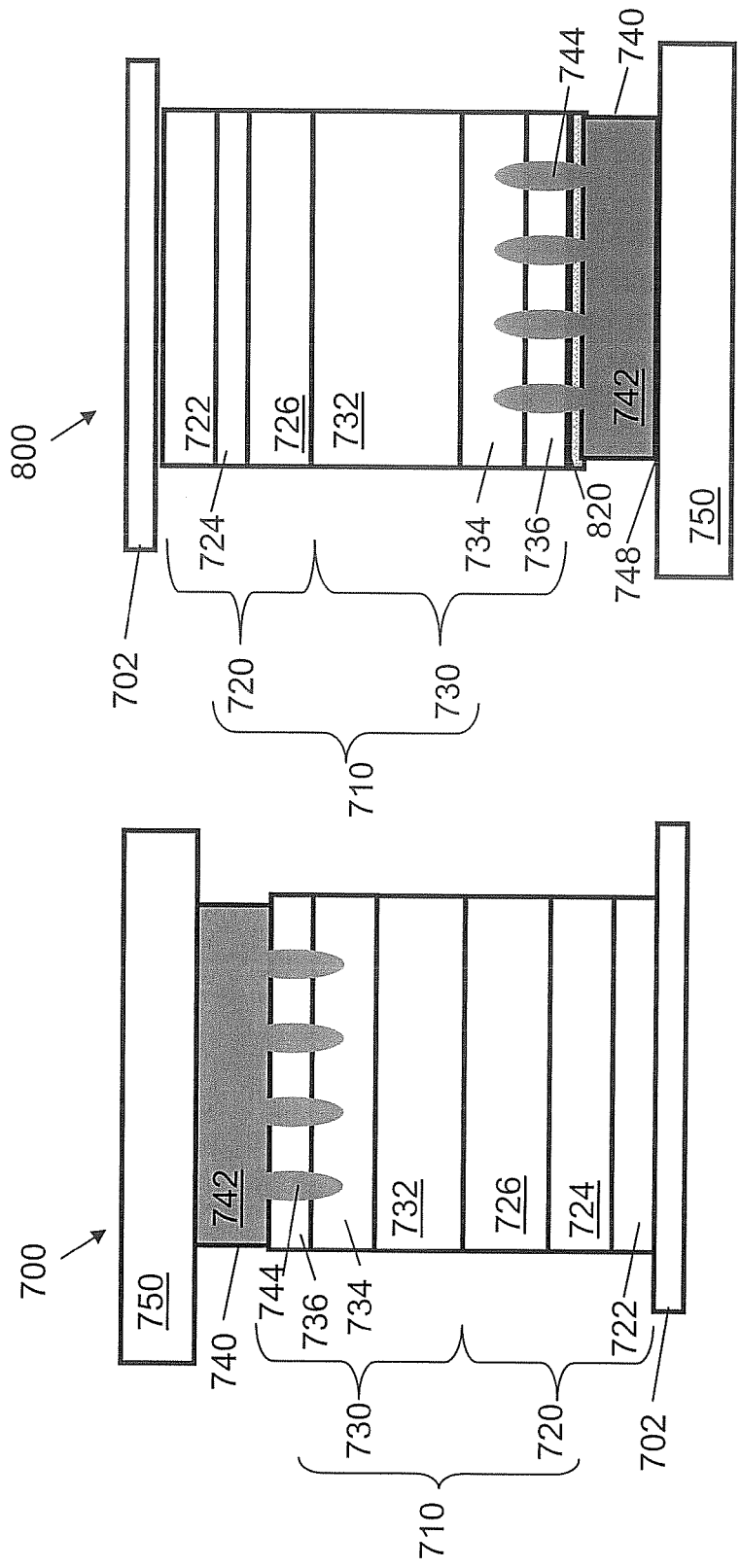

TEXTURED METALLIC BACK REFLECTOR

CROSS-REFERENCE TO RELATED APPLICATION

This application is claiming under 35 USC 119(e), the benefit of provisional patent application Ser. No. 61/251,681, filed Oct. 14, 2009, and the benefit of provisional patent application Ser. No. 61/251,684, filed Oct. 14, 2009, all of which are incorporated herein by reference.

BACKGROUND OF THE INVENTION

Field of the Invention

Embodiments of the invention generally relate to the fabrication of solar devices, and more particularly to back reflectors for solar devices and process for fabricating these reflectors.

Description of the Related Art

There is a need for back reflectors which provide diffusive reflection, yet are highly reflecting, and are in ohmic contact with the solar device. There is also a need to form back reflectors, such as textured back reflectors, by non-lithographic techniques.

SUMMARY OF THE INVENTION

Embodiments of the invention generally relate to the fabrication of thin film devices, such as solar devices or other electronic devices, which contain textured back reflectors. Embodiments provide textured back reflectors which are metallic reflectors or metal-dielectric reflectors. Many of the thin film devices described herein generally contain epitaxially grown layers which are formed on a sacrificial layer disposed on or over a support substrate or wafer. Once the thin film devices are formed by epitaxy processes, the thin film devices are subsequently removed from the support substrate or wafer during an epitaxial lift off (ELO) process.

In one embodiment, a textured metallic back reflector is provided which includes an array of metallic islands disposed on a gallium arsenide material, a metallic reflector layer disposed on or over the metallic islands, and a plurality of reflector protrusions formed between the metallic islands and extending from the metallic reflector layer and into the gallium arsenide material.

In another embodiment, a textured metallic back reflector is provided which includes a metallic reflector layer disposed on or over a gallium arsenide material, and a plurality of reflector protrusions extending from the metallic reflector layer and into the gallium arsenide material.

In another embodiment, a textured metallic back reflector is provided which includes an array of metallic islands disposed on a gallium arsenide material, a plurality of apertures disposed between the metallic islands and extending into the gallium arsenide material, a metallic reflector layer disposed on or over the metallic islands, and a plurality of reflector protrusions formed between the metallic islands and extending from the metallic reflector layer and into the apertures formed in the gallium arsenide material.

In another embodiment, a textured metallic back reflector is provided which includes an array of metallic islands disposed on a gallium arsenide material, a plurality of apertures disposed between the metallic islands and extending into the gallium arsenide material, and a metallic reflector layer disposed within and filling the apertures and over the metallic islands.

The gallium arsenide material may contain various gallium arsenide layers, such as a gallium arsenide cell. The gallium arsenide cell may contain a p-type gallium arsenide layer or stack disposed above an n-type gallium arsenide layer or stack. In one example, the p-type gallium arsenide stack has a thickness within a range from about 100 nm to about 3,000 nm and the n-type gallium arsenide stack has a thickness within a range from about 100 nm to about 2,000 nm. In one example, n-type gallium arsenide stack has a thickness of about 200 nm, and in another example, within a range from about 700 nm to about 1,200 nm.

The metallic layer may contain at least one metal, such as silver, gold, aluminum, nickel, copper, platinum, palladium, alloys thereof, derivatives thereof, and combinations thereof. In specific examples, the metallic layer may contain silver, copper, or gold. The metallic layer may have a thickness within a range from about 2 nm to about 50 nm, preferably, from about 4 nm to about 40 nm, more preferably, from about 5 nm to about 30 nm, and more preferably, from about 10 nm to about 20 nm.

The metallic islands may contain at least one metal, such as silver, gold, aluminum, nickel, copper, platinum, palladium, alloys thereof, derivatives thereof, and combinations thereof. In specific examples, the metallic islands may contain silver, copper, or gold. In some embodiments, each metallic island may have a diameter within a range from about 50 nm to about 500 nm, preferably, from about 100 nm to about 400 nm, and more preferably, from about 150 nm to about 300 nm. Each metallic island may have a thickness within a range from about 20 nm to about 100 nm, preferably, from about 30 nm to about 80 nm, and more preferably, from about 45 nm to about 60 nm.

In some examples, each metallic island may be spaced apart from a neighboring metallic island at a distance within a range from about 50 nm to about 1,000 nm, such as from about 100 nm to about 700 nm, or such as from about 150 nm to about 500 nm. The array of metallic islands may have a surface density/concentration of about 1 metallic island per about 0.3 $\mu m^2$.

In some embodiments, each aperture formed within the gallium arsenide material may have a diameter within a range from about 50 nm to about 1,000 nm, preferably, from about 100 nm to about 700 nm, and more preferably, from about 150 nm to about 500 nm. Each aperture may have a length within a range from about 30 nm to about 300 nm, such as from about 60 nm to about 160 nm.

In an alternative embodiment, an adhesion layer may be deposited or formed on the gallium arsenide material before depositing the metallic reflector layer and/or the reflector protrusions. In one example, the adhesion layer may be disposed between the gallium arsenide material and the metallic reflector layer. In another example, the adhesion layer may be disposed between the gallium arsenide material and the reflector protrusions. The adhesion layer may contain nickel, titanium, chromium, alloys thereof, derivatives thereof, or combinations thereof. The adhesion layer may have a thickness within a range from about 1 Å to about 20 Å. The adhesion layer may be deposited by PVD, ALD, or CVD techniques.

The metallic reflector layer may contain at least one metal, such as silver, gold, aluminum, nickel, copper, platinum, palladium, alloys thereof, derivatives thereof, and combinations thereof. In specific examples, the metallic reflector layer may contain silver, copper, or gold. The metallic reflector layer may have a thickness within a range from about 15 nm to about 2,000 nm or greater. In some examples, the thickness of the metallic reflector layer may be from about 20 nm to about 750 nm, preferably, from about 50 nm to about 500 nm, and more preferably, from about 100 nm to about 250 nm.

Similarly, the reflector protrusions contain at least one metal, such as silver, gold, aluminum, nickel, copper, platinum, palladium, alloys thereof, derivatives thereof, and combinations thereof. In specific examples, the reflector protrusions may contain silver, copper, or gold. Each protrusion may have a diameter within a range from about 50 nm to about 500 nm, preferably, from about 100 nm to about 400 nm, and more preferably, from about 150 nm to about 300 nm. Each protrusion may have a length within a range from about 30 nm to about 300 nm, such as from about 60 nm to about 160 nm.

In other embodiments described herein, a method for forming a textured metallic back reflector is provided which includes depositing a metallic layer on a gallium arsenide material within a thin film stack, forming an array of metallic islands from the metallic layer during an annealing process, removing or etching material from the gallium arsenide material to form apertures between the metallic islands, and depositing a metallic reflector layer to fill the apertures and cover the metallic islands.

In some embodiments, the method for forming a textured metallic back reflector containing silver by depositing a metallic layer containing silver on the gallium arsenide material disposed on the substrate, forming an array of metallic islands containing silver from the metallic layer during an annealing process, removing or etching material from the gallium arsenide material to form apertures between the metallic islands, and depositing a metallic reflector layer containing silver to fill the apertures and cover the metallic islands.

In some embodiments, the array of metallic islands may be formed from the metallic layer during the annealing process. The method may include exposing the substrate to nitrogen gas within a processing system and heating the metallic layer to a temperature of about 200° C. during the annealing process. The formation of the metallic islands is due to the film dewetting and agglomeration of the metallic layer.

In some embodiments, the metallic layer and the metallic reflector layer may each independently contain silver. The metallic layer and the metallic reflector layer may contain the same material or may contain different materials from one another. The metallic layer and the metallic reflector layer may be deposited by a vapor deposition process, such as a vacuum evaporation process, a PVD process, a CVD process, or an ALD process. The metallic layer and the metallic reflector layer may each independently be deposited at a temperature within a range from about 18° C. to about 50° C., preferably, from about 20° C. to about 30° C., and more preferably, from about 22° C. to about 25° C. Alternatively, the metallic layer and the metallic reflector layer may each independently be deposited at higher temperatures, such as at temperatures greater than 50° C., for example, at temperatures of about 100° C. or greater, about 200° C. or greater, about 300° C. or greater, about 400° C. or greater, or greater than about 500° C.

In another embodiment, a sacrificial layer may be disposed between the gallium arsenide material and the substrate. The sacrificial layer may contain aluminum arsenide, alloys thereof, or derivatives thereof. The sacrificial layer may be removed and the gallium arsenide material and the substrate are separated during an ELO process. The ELO process may occur prior or subsequent to the annealing process.

In another embodiment as described herein, a textured metallic back reflector is provided which includes a dielectric layer disposed on a gallium arsenide material, an array of metallic islands disposed on the dielectric layer, a metallic reflector layer disposed on or over the metallic islands, and a plurality of reflector protrusions formed between the metallic islands and extending from the metallic reflector layer, through the dielectric layer, and into the gallium arsenide material.

In another embodiment, a textured metal-dielectric back reflector is provided which includes a dielectric layer disposed on a gallium arsenide material, a metallic reflector layer disposed on or over the dielectric layer, and a plurality of reflector protrusions extending from the metallic reflector layer, through the dielectric layer, and into the gallium arsenide material.

In another embodiment, a textured metal-dielectric back reflector is provided which includes a dielectric layer disposed on a gallium arsenide material, an array of metallic islands disposed on the dielectric layer, a plurality of apertures disposed between the metallic islands and extending through the dielectric layer and into the gallium arsenide material, a metallic reflector layer disposed on or over the metallic islands, and a plurality of reflector protrusions formed between the metallic islands and extending from the metallic reflector layer and into the apertures formed in the dielectric layer and the gallium arsenide material.

In another embodiment, a textured metal-dielectric back reflector is provided which includes a dielectric layer disposed on a gallium arsenide material, an array of metallic islands disposed on the dielectric layer, a plurality of apertures formed between the metallic islands and extending through the dielectric layer and into the gallium arsenide material, a metallic reflector layer disposed within and filling the apertures and over the metallic islands.

In another embodiment, a textured metal-dielectric back reflector is provided which includes a dielectric layer disposed on a gallium arsenide material, an array of metallic islands disposed on the dielectric layer, a metallic reflector layer disposed on or over the metallic islands, and a plurality of reflector protrusions formed between the metallic islands and extending from the metallic reflector layer, through the dielectric layer, and into the gallium arsenide material.

In some embodiments, the dielectric layer contains a dielectric material with a refractive index within a range from about 1 to about 3. The dielectric layer may contain at least one dielectric material such as aluminum oxide, titanium oxide, tin oxide, indium oxide, zinc oxide, zinc sulfide, silicon oxide, silicon oxynitride, derivatives thereof, or combinations thereof. In many embodiments, the dielectric layer contains at least one dielectric material such as silicon oxide, silicon dioxide, silicon nitride, silicon oxynitride, derivatives thereof, or combinations thereof. In one example, the dielectric layer contains silicon oxide. In another example, the dielectric layer contains silicon oxynitride. The dielectric layer may have a thickness within a range from about 10 nm to about 150 nm, preferably, from about 20 nm to about 100 nm, and more preferably, from about 30 nm to about 80 nm.

In other embodiments, the dielectric layer contains a dielectric material that is completely or substantially resistant to being etched when exposed to hydrofluoric acid during an ELO process. Dielectric material contained within the dielectric layer and which is resistant to hydrofluoric acid includes zinc sulfide, silicon nitride, derivatives thereof, or combinations thereof.

In an alternative embodiment, an adhesion layer may be deposited or formed on the gallium arsenide material or the dielectric layer before depositing the metallic reflector layer and/or the reflector protrusions. In one example, the adhesion layer may be disposed between the gallium arsenide material or the dielectric layer and the metallic reflector layer. In another example, the adhesion layer may be disposed between the gallium arsenide material or the dielectric layer and the reflector protrusions. The adhesion layer may contain nickel, titanium, chromium, alloys thereof, derivatives thereof, or combinations thereof. The adhesion layer may have a thickness within a range from about 1 Å to about 20 Å. The adhesion layer may be deposited by PVD, ALD, or CVD techniques.

In another embodiment as described herein, a method for forming a textured metal-dielectric back reflector is provided which includes depositing a dielectric layer on a gallium arsenide material within a thin film stack, depositing a metallic layer on the dielectric layer, forming an array of metallic islands from the metallic layer during an annealing process, removing material from the dielectric layer to form apertures between the metallic islands during a first etching process, removing material from the gallium arsenide material to extend the apertures into the gallium arsenide material during a second etching process, and depositing a metallic reflector layer to fill the apertures and cover the metallic islands. In some examples, the etching process for etching or removing material of the dielectric layer may be a buffered oxide etch (BOE) process.

In another embodiment, a method for forming a textured metal-dielectric back reflector is provided which includes depositing a dielectric layer on a gallium arsenide material within a thin film stack, depositing a metallic layer on the dielectric layer, forming an array of metallic islands from the metallic layer during an annealing process, removing or etching material from the dielectric layer and the gallium arsenide material to form apertures between the metallic islands, and depositing a metallic reflector layer to fill the apertures and cover the metallic islands.

In another embodiment, a method for forming a textured metal-dielectric back reflector is provided which includes depositing a dielectric layer on a gallium arsenide material within a thin film stack, depositing a metallic layer containing silver on the dielectric layer, forming an array of metallic islands containing silver from the metallic layer during an annealing process, removing material from the dielectric layer to form apertures between the metallic islands during a first etching process, removing material from the gallium arsenide material to extend the apertures into the gallium arsenide material during a second etching process, and depositing a metallic reflector layer containing silver to fill the apertures and cover the metallic islands.

In another embodiment, a method for forming a textured metal-dielectric back reflector is provided which includes depositing a dielectric layer on a gallium arsenide material within a thin film stack, depositing a metallic layer containing silver on the dielectric layer, forming an array of metallic islands containing silver from the metallic layer during an annealing process, removing or etching material from the dielectric layer and the gallium arsenide material to form apertures between the metallic islands, and depositing a metallic reflector layer containing silver to fill the apertures and cover the metallic islands.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 illustrates a flow chart depicting a process for forming a back reflector according to embodiments described herein;

FIGS. 2A-2G depict a gallium arsenide stack at progressive stages of forming a back reflector thereon, according to embodiments described herein;

FIGS. 4A-4E depict a gallium arsenide stack at progressive stages of forming another back reflector thereon, according to other embodiments described herein;

FIGS. 5A-5D depict another gallium arsenide stack at progressive stages of forming another back reflector thereon, according to other embodiments described herein;

FIGS. 6A-6D depict another gallium arsenide stack at progressive stages of forming another back reflector thereon, according to other embodiments described herein;

FIGS. 7A-7E depict another gallium arsenide stack at progressive stages of forming another back reflector thereon, according to other embodiments described herein;

FIG. 8 depicts another gallium arsenide stack containing a back reflector, according to other embodiments described herein.

DETAILED DESCRIPTION

FIG. 1 illustrates a flow chart depicting a process for forming an integrated textured back reflector according to one embodiment. FIGS. 2A-2G depicts a gallium arsenide stack containing a dielectric layer during progressive stages of fabricating a textured back reflector in another embodiment. In some examples, textured back reflector 250 may be fabricated on gallium arsenide stack 200 during process 100. Gallium arsenide material and gallium arsenide stack is referred to throughout the present specification. One of ordinary skill in the art recognizes that there may be other elements present in these materials and their presence are within the spirit and scope of the present invention.

Figure 2A:
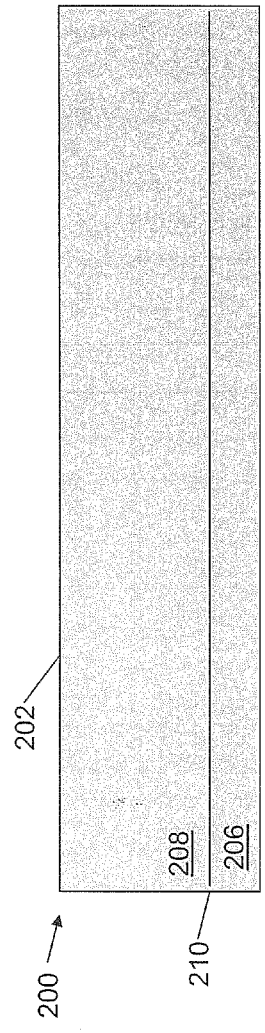

FIG. 2A depicts gallium arsenide cell 210 contained within gallium arsenide stack 200, as described in one embodiment herein. Gallium arsenide cell 210 includes upper portion 208 disposed on or over lower portion 206 and has upper surface 202. Lower portion 206 and upper portion 208 of gallium arsenide cell 210 may each independently contain a single layer or multiple layers of various materials.

In some embodiments, lower portion 206 of gallium arsenide cell 210 may be an n-type gallium arsenide stack while upper portion 208 of gallium arsenide cell 210 may be a p-type gallium arsenide stack. In one embodiment, lower portion 206 may contain be n-type materials, such as a contact layer, a passivation layer, and an emitter layer. In one example, lower portion 206 may contain an n-type gallium arsenide emitter layer disposed on or over a front window (e.g., a passivation layer) disposed on or over an n-type gallium arsenide contact layer. In another embodiment, upper portion 208 may contain be p-type materials, such as an absorber layer, a passivation layer, and a contact layer. In one example, upper portion 208 may contain may contain a p-type gallium arsenide contact layer disposed on or over a rear window (e.g., a passivation layer) disposed on or over a p-type gallium arsenide absorber layer. In another embodiment, gallium arsenide cell 210 depicted in FIG. 2A has the same layers as gallium arsenide cell 510 depicted in FIG. 5A.

Figure 2B:
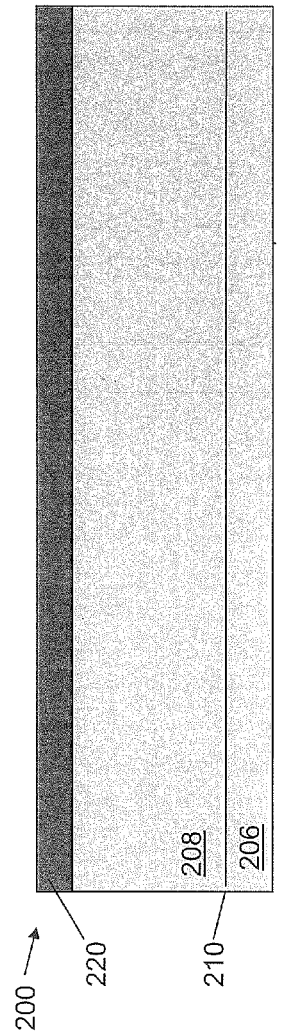

Step 110 of process 100 includes forming or depositing at least one dielectric material or layer on a gallium arsenide material, such as dielectric layer 220 disposed on gallium arsenide cell 210 as depicted in FIG. 2B. Dielectric layer 220 is deposited and in physical contact with gallium arsenide cell 210, such as upper portion 208 of gallium arsenide cell 210. In one embodiment, dielectric layer 220 is formed by a vapor deposition process during step 110. The vapor deposition process may include CVD, PE-CVD, ALD, PE-ALD, and PVD processes.

In some embodiments, dielectric layer 220 contains a dielectric material with a refractive index within a range from about 1 to about 3. Dielectric layer 220 may contain at least one dielectric material such as aluminum oxide, titanium oxide, tin oxide, indium oxide, zinc oxide, zinc sulfide, silicon oxide, silicon oxynitride, dopant variants thereof, derivatives thereof, or combinations thereof. In many embodiments, dielectric layer 220 contains at least one dielectric material such as silicon oxide, silicon dioxide, silicon nitride, silicon oxynitride, dopant variants thereof, derivatives thereof, or combinations thereof. In one example, dielectric layer 220 contains silicon oxide. In another example, dielectric layer 220 contains silicon oxynitride.

In one embodiment, dielectric layer 220 contains a dielectric material that is completely or substantially resistant to being etched when exposed to hydrofluoric acid during an ELO process. Dielectric material contained within dielectric layer 220 and which is resistant to hydrofluoric acid includes zinc sulfide, silicon nitride, derivatives thereof, or combinations thereof. Dielectric layer 220 may have a thickness within a range from about 10 nm to about 150 nm, preferably, from about 20 nm to about 100 nm, and more preferably, from about 30 nm to about 80 nm.

Figure 2C:
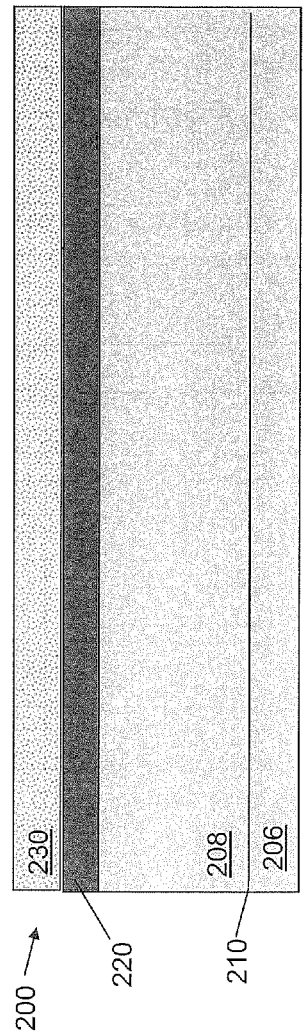

Step 120 of process 100 includes forming or depositing at least one metallic layer on the dielectric layer, such as metallic layer 230 disposed on dielectric layer 220 as depicted in FIG. 2C. Metallic layer 230 may be deposited by a vapor deposition process, such as a vacuum evaporation process, a PVD or sputtering process, a CVD process, or an ALD process. Metallic layer 230 may be deposited at a temperature within a range from about 18° C. to about 50° C., preferably, from about 20° C. to about 30° C., and more preferably, from about 22° C. to about 25° C. Alternatively, metallic layer 230 may be deposited at higher temperatures, such as at temperatures greater than 50° C., for example, at temperatures of about 100° C. or greater, about 200° C. or greater, about 300° C. or greater, about 400° C. or greater, or greater than about 500° C.

Metallic layer 230 may contain at least one metal, such as silver, gold, aluminum, nickel, copper, platinum, palladium, alloys thereof, derivatives thereof, and combinations thereof. In one example, metallic layer 230 contains silver or a silver alloy. In other examples, metallic layer 230 may contain copper, copper alloys, gold, gold alloys, or combinations thereof. Metallic layer 230 may have a thickness within a range from about 2 nm to about 50 nm, preferably, from about 4 nm to about 40 nm, more preferably, from about 5 nm to about 30 nm, and more preferably, from about 10 nm to about 20 nm.

Step 130 of process 100 includes forming an array of metallic islands from the metallic layer onto a dielectric layer during an annealing process, as described in another embodiment herein. Alternatively, the array of metallic islands may be deposited directly onto the dielectric layer. The method may include exposing the substrate or gallium arsenide stack 200 to nitrogen gas within a processing system and heating metallic layer 230 containing silver to a temperature of about 200° C. or greater during the annealing process. Metallic islands 232 are formed due to the film dewetting and agglomeration of metallic layer 230. Each metallic island 232 may be spaced apart from a neighboring metallic island 232 at distance 238.

FIG. 2D depicts an array of metallic islands 232 formed from metallic layer 230 and formed on dielectric layer 220. The array of metallic islands 232 are spaced apart to form gaps 234 therebetween having distance 238. Generally, metallic islands 232 may have an average particle diameter, such as diameter 236.

In some embodiments, each metallic island 232 may have diameter 236 within a range from about 50 nm to about 500 nm, preferably, from about 100 nm to about 400 nm, and more preferably, from about 150 nm to about 300 nm. Each metallic island 232 may have a thickness within a range from about 20 nm to about 100 nm, preferably, from about 30 nm to about 80 nm, and more preferably, from about 45 nm to about 60 nm. Each gap 234 may have a lateral length within a range from about 50 nm to about 1,000 nm, such as from about 100 nm to about 700 nm, or such as from about 150 nm to about 500 nm. The array of metallic islands 232 may have a surface density/concentration of about 1 metallic island per about 0.3 $\mu m^2$.

In another embodiment, metallic islands 232 usually contain the same material as metallic layer 230. Therefore, metallic islands 232 may contain at least one metal, such as silver, gold, aluminum, nickel, copper, platinum, palladium, alloys thereof, derivatives thereof, and combinations thereof. In specific examples, metallic islands 232 may contain silver, copper, or gold. In one example, metallic islands 232 contain silver or a silver alloy. In other examples, metallic islands 232 may contain copper, copper alloys, gold, gold alloys, or combinations thereof.

Step 140 of process 100 includes removing or etching dielectric layer 220, between metallic islands 232, as depicted in FIG. 2E. Dielectric material is removed from dielectric layer 220 while forming apertures 224 between metallic islands 232. Apertures 224 extend through dielectric layer 220 and reach to upper portion 208 of gallium arsenide cell 210. In some embodiments, each aperture 224 may have a diameter within a range from about 50 nm to about 1,000 nm, preferably, from about 100 nm to about 700 nm, and more preferably, from about 150 nm to about 500 nm.

In some embodiments, dielectric layer 220 may be exposed to a dielectric etch solution during step 140. The dielectric etch solution may be a buffered oxide etch (BOE) solution and contain ammonium fluoride and/or hydrofluoric acid in an aqueous solution. For example, the dielectric etch solution may contain water, ammonium fluoride, and hydrofluoric acid. In a specific example, the dielectric etch solution may contain by volume about 9% of HF, about 32% of $NH_4F$, and remainder of water. In other examples, the dielectric etch solution may contain water and ammonium fluoride. In another example, the dielectric etch solution may contain water and hydrofluoric acid.

In other embodiments during step 140, dielectric layer 220 may be exposed to a gas or plasma during a dry etching process, such as a reactive ion etching (RIE) process. During the dry etching process, dielectric material is exposed to the reactive gas or plasma and removed from dielectric layer 220 to forming apertures 224. Dielectric layer 220 may be exposed to etch gases or plasmas containing $XeF_2$, $SF_6$, $C_4F_8$, derivatives thereof, or combinations thereof. Etch gases and plasmas may further contain other reagent gases or carrier gases. Exemplary carrier gases may include argon, helium, neon, xenon, hydrogen, nitrogen, or combinations thereof.

Figure 2F:
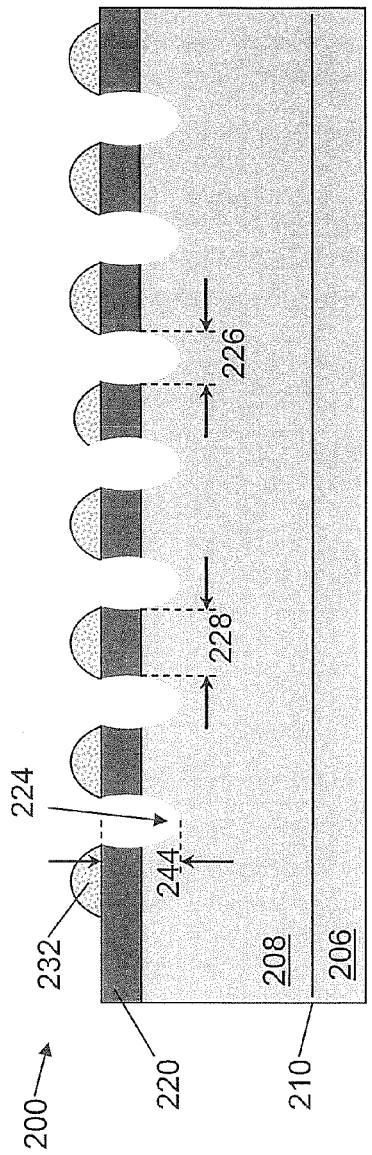

Step 150 of process 100 includes extending the depth or length of apertures 224 into upper portion 208 of gallium arsenide cell 210 by removing or etching gallium arsenide material from upper portion 208, as depicted in FIG. 2F. The etching process in step 150 may be a wet process or a dry process as described for in step 140. In one example, apertures 224 is exposed to a dielectric etch solution and the depth of apertures 224 is elongated into upper portion 208 of gallium arsenide cell 210 as gallium arsenide material is etched therefrom. In another example, apertures 224 is exposed to dry etching process, such as the RIE process, and the depth of apertures 224 is elongated into upper portion 208 of gallium arsenide cell 210 as gallium arsenide material is etched therefrom.

The depth or length of apertures 224 may have a length 244. Length 244 is both the depth of each aperture 224 as well as the length of each reflector protrusion 242. Each aperture 224 may have a length within a range from about 30 nm to about 300 nm, such as from about 60 nm to about 160 nm.

In another embodiment described herein, upper portion 208 of gallium arsenide cell 210 may be exposed to a second etch solution to remove or etch the gallium arsenide material disposed therein while extending apertures 224. In one example, upper portion 208 of gallium arsenide cell 210 may be exposed to a piranha etch solution. The piranha etch solution may be used to etch both gallium arsenide materials as well as aluminum arsenide materials. The piranha etch solution contains at least sulfuric acid, hydrogen peroxide, and water. In one example, the piranha etch solution may be concentrated and may have a volumetric concentration ratio of sulfuric acid to hydrogen peroxide to water of about 1 to about 8 to about 100 ($H_2SO_4:H_2O_2:H_2O$ is about 1:8:100), and have an etch rate of about 300 nm/min. In another example, the piranha etch solution may be more dilute and may have a volumetric concentration ratio of sulfuric acid to hydrogen peroxide to water of about 1 to about 8 to about 500 ($H_2SO_4:H_2O_2:H_2O$ is about 1:8:500), and have an etch rate of about 60 nm/min. In another example, the piranha etch solution may be further diluted and may have a volumetric concentration ratio of sulfuric acid to hydrogen peroxide to water of about 1 to about 8 to about 1,000 ($H_2SO_4:H_2O_2:H_2O$ is about 1:8:1,000), and have an etch rate of about 30 nm/min.

In another embodiment, upper portion 208 of gallium arsenide cell 210 may be exposed to a citric acid etch solution for removing gallium arsenide material disposed within the contact layer, but not within a passivation layer containing aluminum arsenide, while extending apertures 224. The citric acid etch solution may contain citric acid, ammonium hydroxide, and hydrogen peroxide. In one example, the citric acid etch solution may be formed by dissolving about 1.5 g citric acid in about 100 mL of $H_2O$, add ammonium hydroxide solution until the pH reaches about 6.2, and subsequently add about 2 mL of $H_2O_2$ in the solution. The citric acid etch solution etches gallium arsenide material but not the aluminum arsenide material, wherein $Al_xGa_{1-x}As$, and x≥about 0.2. Therefore, the citric acid etch solution may be used to etch through the contact layer containing gallium arsenide material, but stop etching at the passivation layer containing aluminum arsenide material—which could be etched by using a different etching solution, such as the above described piranha etch solution.

Alternatively, the etching of the gallium arsenide by the citric acid etch solution could be followed by etching the aluminum arsenide (but not gallium arsenide) with an iodine-containing etch solution. The iodine etch solution may contain potassium iodine, iodine, sulfuric acid, and water. In one example, the iodine etch solution may have a concentration ratio by weight of potassium iodine to iodine to water to sulfuric acid of about 100 to about 60 to about 90 to about 250 ($KI:I_2:H_2O:H_2SO_4$ is about 100:60:90:250). The iodine etch solution may be formed by combining potassium iodine, iodine, and water, then mix in equal parts of sulfuric acid as the pH is about 0.9.

Figure 2G:
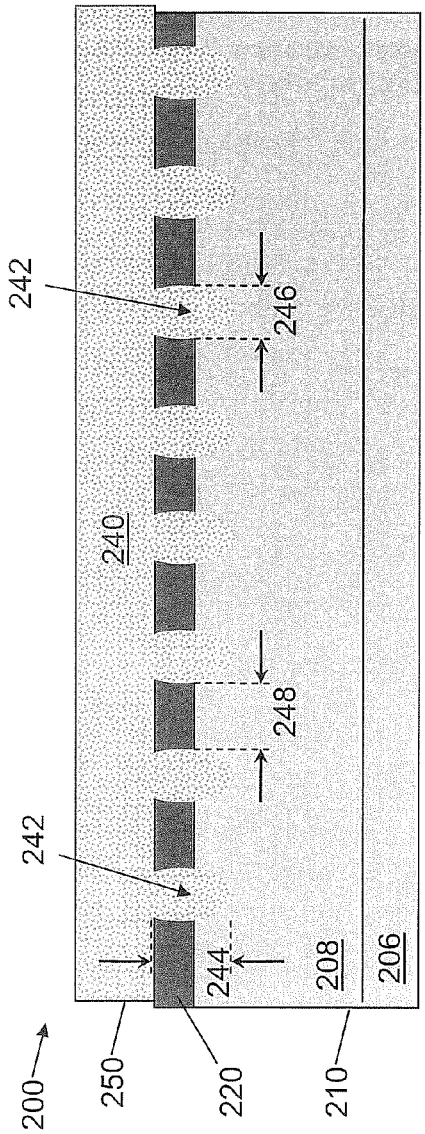

Step 160 of process 100 includes filling apertures 224 and covering any metallic islands 232 and portions dielectric layer 220 with at least one metal, while forming textured back reflector 250, as depicted in FIG. 2G. Textured back reflector 250 contains metallic reflector layer 240 and reflector protrusions 242. Reflector protrusions 242 are formed as apertures 224 are filled with the metal. Similarly, metallic reflector layer 240 is formed as metallic islands 232 and portions of dielectric layer 220 are covered with the metal. Reflector protrusions 242 are in ohmic electric contact with gallium arsenide cell 210, such as upper portion 208 of gallium arsenide cell 210.

FIG. 2G depicts gallium arsenide stack 200 containing textured back reflector 250 disposed on dielectric layer 220 and extending into upper portion 208 of gallium arsenide cell 210, as described in some embodiments herein. Textured back reflector 250 contains metallic reflector layer 240 and reflector protrusions 242. Metallic reflector layer 240 may be disposed on or over dielectric layer 220 and a p-type gallium arsenide stack, such as on or over a contact layer within upper portion 208 of gallium arsenide cell 210. Reflector protrusions 242 extend from metallic reflector layer 240, through dielectric layer 220 (e.g., a contact layer) and into a passivation layer (e.g., a rear window) within upper portion 208 of gallium arsenide cell 210.

In other embodiments, gallium arsenide stack 200 containing textured back reflector 250 disposed on dielectric layer 220 and extending into upper portion 208 of gallium arsenide cell 210, as depicted in FIG. 2G may be the same thin film stack as gallium arsenide stack 600 containing textured back reflector 540 disposed on dielectric layer 620 and extending into p-type gallium arsenide stack 530 of gallium arsenide cell 510, as depicted in FIG. 6B. Also, gallium arsenide stack 200 may be the same thin film stack as gallium arsenide stack 800 containing textured back reflector 740 disposed on dielectric layer 820 and extending into p-type gallium arsenide stack 730 of gallium arsenide cell 710, as depicted in FIG. 8.

Textured back reflector 250, including metallic reflector layer 240 and/or reflector protrusions 242, contains at least one metal, such as silver, gold, aluminum, nickel, copper, platinum, palladium, alloys thereof, derivatives thereof, and combinations thereof. In specific examples, metallic reflector layer 240 and/or reflector protrusions 242 contain silver, copper, or gold. Metallic reflector layer 240 may have a thickness within a range from about 15 nm to about 2,000 nm or greater. In some examples, the thickness of the metallic reflector layer may be from about 20 nm to about 750 nm, preferably, from about 50 nm to about 500 nm, and more preferably, from about 100 nm to about 250 nm. Each reflector protrusions 242 may have a diameter within a range from about 50 nm to about 500 nm, preferably, from about 100 nm to about 400 nm, and more preferably, from about 150 nm to about 300 nm. Each reflector protrusions 242 may also have a length within a range from about 30 nm to about 300 nm, such as from about 60 nm to about 160 nm.

Figure 2H:
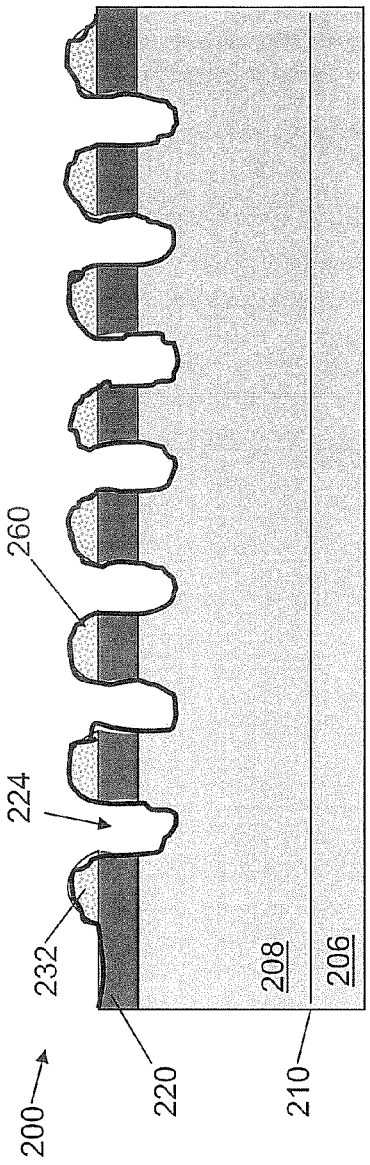
FIGS. 2H-2I depict a gallium arsenide stack at progressive stages of forming a back reflector with an adhesion layer thereon, according to an alternative embodiment described herein.
Figure 2I:
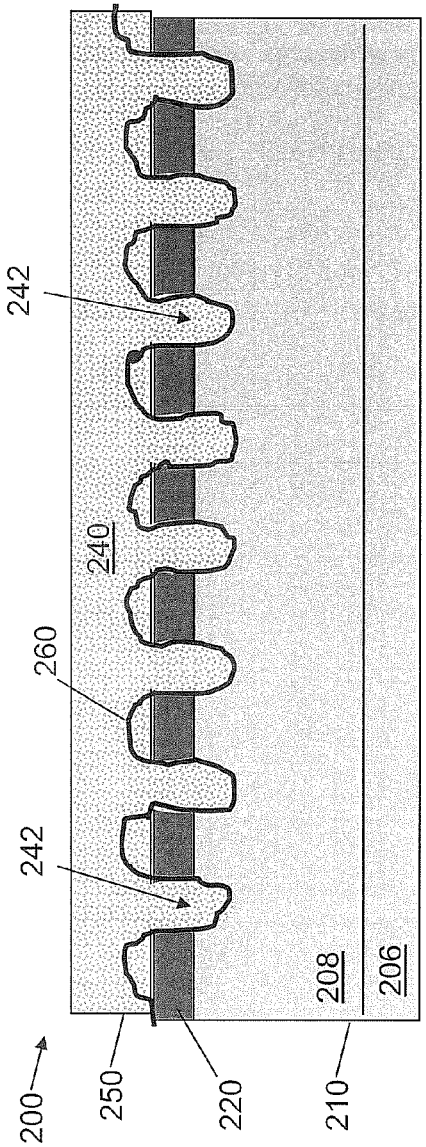

In an alternative embodiment, as depicted in FIGS. 2H-2I, adhesion layer 260 may be deposited or formed on or over gallium arsenide material, such as upper portion 208 of gallium arsenide cell 210, metallic islands 232, or dielectric layer 220 before depositing metallic reflector layer 240 and/or reflector protrusions 242. Apertures 224 are formed within upper portion 208 of gallium arsenide cell 210 as depicted in FIG. 2F. Thereafter, adhesion layer 260 may be formed on gallium arsenide stack 200 as depicted in FIG. 2H during optional step 155 in process 100. Subsequently, metallic reflector layer 240 may be disposed on or over adhesion layer 260, as depicted in FIG. 2I during step 160.

In one example, adhesion layer 260 may be disposed between gallium arsenide cell 210 or dielectric layer 220 and metallic reflector layer 240. In another example, adhesion layer 260 may be disposed between gallium arsenide cell 210 or dielectric layer 220 and reflector protrusions 242. Adhesion layer 260 may contain nickel, titanium, chromium, alloys thereof, derivatives thereof, or combinations thereof. Adhesion layer 260 may have a thickness within a range from about 1 Å to about 20 Å. Adhesion layer 260 may be deposited by PVD, ALD, or CVD techniques.

Figure 3:
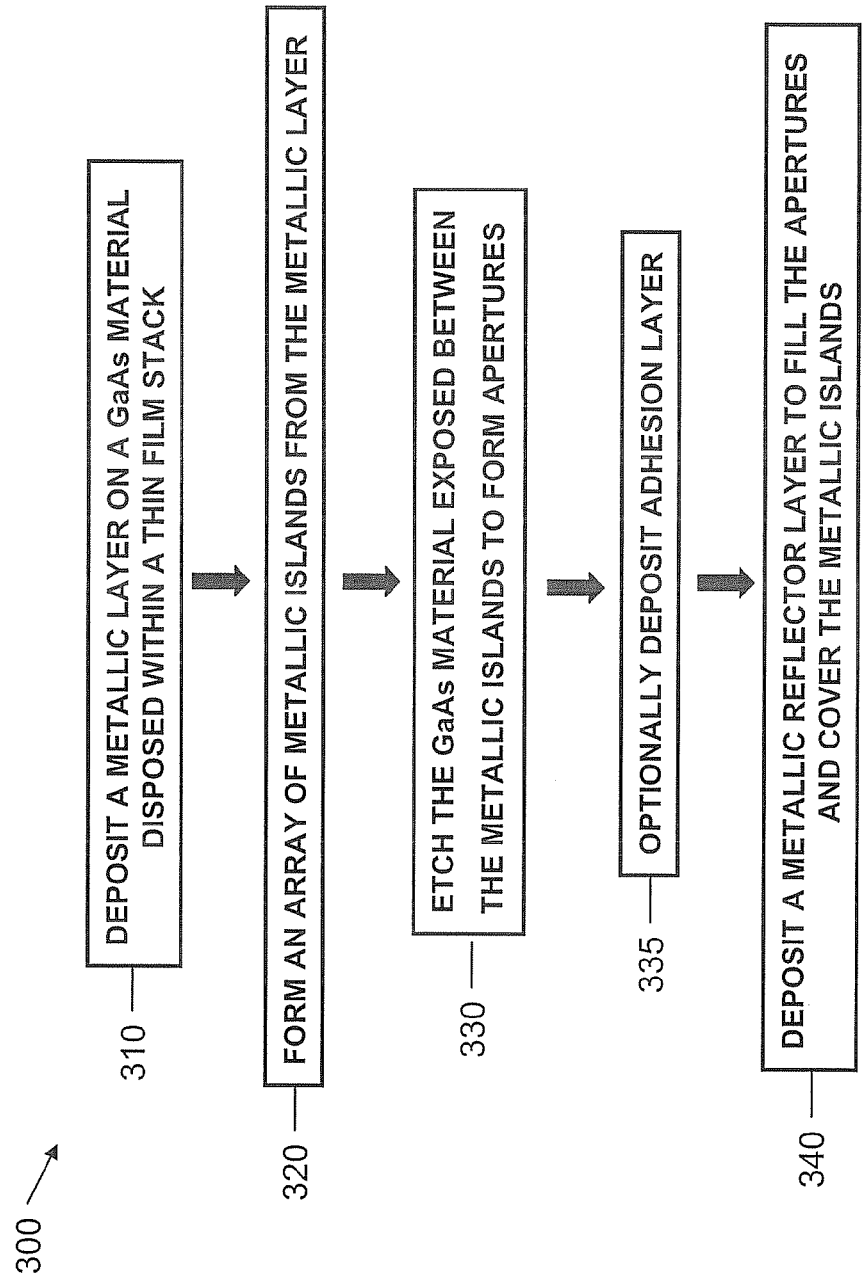
FIG. 3 illustrates a flow chart depicting a process for forming another back reflector according to other embodiments described herein.

FIG. 3 illustrates a flow chart depicting a process for forming an integrated textured back reflector according to one embodiment. FIGS. 4A-4E depicts a gallium arsenide stack during progressive stages of fabricating a textured back reflector in another embodiment. In some examples, gallium arsenide stack 400 containing a textured back reflector may be fabricated during process 300.

FIG. 4A depicts gallium arsenide cell 210 contained within gallium arsenide stack 400. Gallium arsenide cell 210 includes upper portion 208 disposed on or over lower portion 206 and has upper surface 202. Lower portion 206 and upper portion 208 of gallium arsenide cell 210 may each independently contain a single layer or multiple layers of various materials.

In some embodiments, lower portion 206 of gallium arsenide cell 210 may be an n-type gallium arsenide stack while upper portion 208 of gallium arsenide cell 210 may be a p-type gallium arsenide stack. In one embodiment, lower portion 206 may contain be n-type materials, such as a contact layer, a passivation layer, and an emitter layer. In one example, lower portion 206 may contain an n-type gallium arsenide emitter layer disposed on or over a front window (e.g., a passivation layer) disposed on or over an n-type gallium arsenide contact layer. In another embodiment, upper portion 208 may contain be p-type materials, such as an absorber layer, a passivation layer, and a contact layer. In one example, upper portion 208 may contain may contain a p-type gallium arsenide contact layer disposed on or over a rear window (e.g., a passivation layer) disposed on or over a p-type gallium arsenide absorber layer.

Figure 4C:
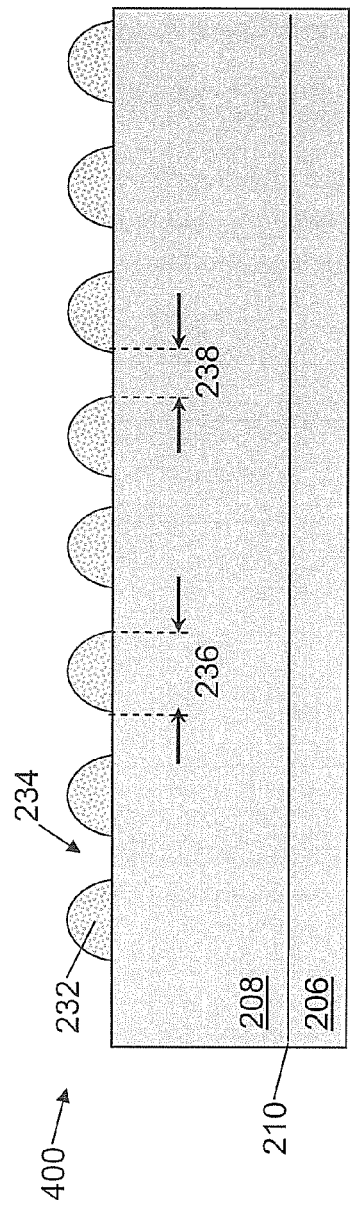

Step 310 of process 300 includes forming or depositing at least one metallic layer on a gallium arsenide material or gallium arsenide cell, such as depositing metallic layer 230 on upper portion 208 of gallium arsenide cell 210, as depicted in FIG. 4C. Metallic layer 230 may be deposited by a vapor deposition process, such as a vacuum evaporation process, a PVD or sputtering process, a CVD process, or an ALD process. Metallic layer 230 may be deposited at a temperature within a range from about 18° C. to about 50° C., preferably, from about 20° C. to about 30° C., and more preferably, from about 22° C. to about 25° C. Alternatively, metallic layer 230 may be deposited at higher temperatures, such as at temperatures greater than 50° C., for example, at temperatures of about 100° C. or greater, about 200° C. or greater, about 300° C. or greater, about 400° C. or greater, or greater than about 500° C.

Metallic layer 230 may contain at least one metal, such as silver, gold, aluminum, nickel, copper, platinum, palladium, alloys thereof, derivatives thereof, and combinations thereof. In one example, metallic layer 230 contains silver or a silver alloy. In other examples, metallic layer 230 may contain copper, copper alloys, gold, gold alloys, or combinations thereof. Metallic layer 230 may have a thickness within a range from about 2 nm to about 50 nm, preferably, from about 4 nm to about 40 nm, more preferably, from about 5 nm to about 30 nm, and more preferably, from about 10 nm to about 20 nm.

Step 320 of process 300 includes forming an array of metallic islands from the metallic layer onto a gallium arsenide material or gallium arsenide cell during an annealing process, as described in another embodiment herein. Alternatively, the array of metallic islands may be deposited directly onto the gallium arsenide material or gallium arsenide cell.

The method may include exposing metallic layer 230 or gallium arsenide stack 400 to nitrogen gas within a processing system and heating metallic layer 230 containing silver to a temperature of about 200° C. or greater during the annealing process. Metallic islands 232 are formed due to the film dewetting and agglomeration of metallic layer 230.

FIG. 4C depicts an array of metallic islands 232 formed from metallic layer 230 and formed on upper portion 208 of gallium arsenide cell 210. The array of metallic islands 232 are spaced apart to form gaps 234 therebetween. Gaps may be separated a distance 238. Generally, metallic islands 232 may have an average particle diameter, such as diameter 236.

In another embodiment, metallic islands 232 usually contain the same material as metallic layer 230. Therefore, metallic islands 232 may contain at least one metal, such as silver, gold, aluminum, nickel, copper, platinum, palladium, alloys thereof, derivatives thereof, and combinations thereof. In specific examples, metallic islands 232 may contain silver, copper, or gold. In one example, metallic islands 232 contain silver or a silver alloy. In other examples, metallic islands 232 may contain copper, copper alloys, gold, gold alloys, or combinations thereof.

In some embodiments, each metallic island 232 may have diameter 228 within a range from about 50 nm to about 500 nm, preferably, from about 100 nm to about 400 nm, and more preferably, from about 150 nm to about 300 nm. Each metallic island 232 may have a thickness within a range from about 20 nm to about 100 nm, preferably, from about 30 nm to about 80 nm, and more preferably, from about 45 nm to about 60 nm.

In some examples, each metallic island 232 may be spaced apart from a neighboring metallic island 232 at distance 236 within a range from about 50 nm to about 1,000 nm, such as from about 100 nm to about 700 nm, or such as from about 150 nm to about 500 nm. The array of metallic islands 232 may have a surface density/concentration of about 1 metallic island per about 0.3 μm².

Figure 4D:
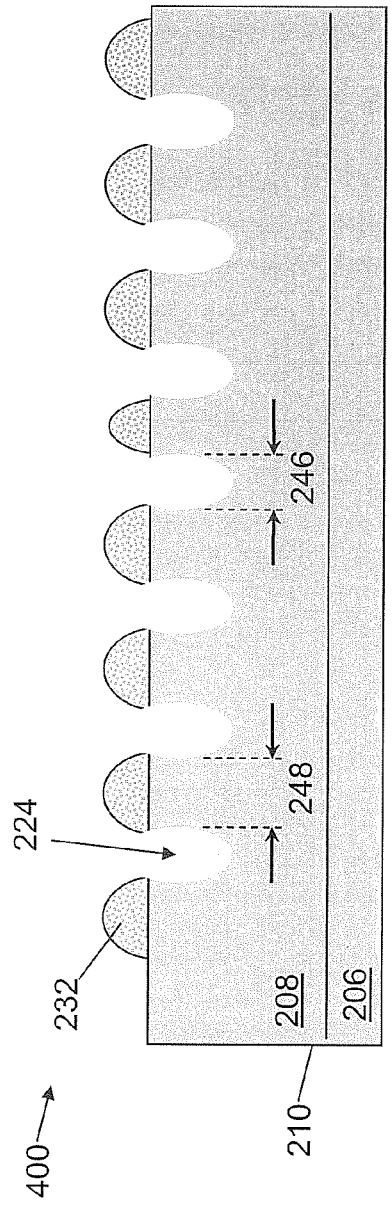

Step 330 of process 300 includes removing or etching material from upper portion 208 of gallium arsenide cell 210, between metallic islands 232, to form apertures 224 extending into upper portion 208 of gallium arsenide cell 210, as depicted in FIG. 4D. At step 330, upper portion 208 of gallium arsenide cell 210 may be exposed to a gas or plasma during a dry etching process, such as the RIE process. During the dry etching process, gallium arsenide material is exposed to the reactive gas or plasma and removed from upper portion 208 to form apertures 224. The gallium arsenide material may be exposed to etch gases or plasmas containing $XeF_2$, $SF_6$, $C_4F_8$, derivatives thereof, or combinations thereof. Etch gases and plasmas may further contain other reagent gases or carrier gases. Exemplary carrier gases may include argon, helium, neon, xenon, hydrogen, nitrogen, or combinations thereof.

The depth or length of apertures 224 may have a length 244. Length 244 is both the depth of each aperture 224 as well as the length of each reflector protrusion 242. Each aperture 224 may have a length within a range from about 30 nm to about 300 nm, such as from about 60 nm to about 160 nm. In some embodiments, each aperture 224 may have a diameter within a range from about 50 nm to about 1,000 nm, preferably, from about 100 nm to about 700 nm, and more preferably, from about 150 nm to about 500 nm.

In another embodiment described herein, upper portion 208 of gallium arsenide cell 210 may be exposed to an etching solution or a dry etch during a second etching process to remove or etch the gallium arsenide material disposed therein while forming apertures 224. In one example, upper portion 208 of gallium arsenide cell 210 may be exposed to a piranha etch solution. The piranha etch solution—described in step 140 of Process 100—may be used to etch both gallium arsenide materials as well as aluminum arsenide materials. The piranha etch solution contains at least sulfuric acid, hydrogen peroxide, and water. In one example, the piranha etch solution may be concentrated and may have a volumetric concentration ratio of sulfuric acid to hydrogen peroxide to water of about 1 to about 8 to about 100 ($H_2SO_4$:$H_2O_2$:$H_2O$ is about 1:8:100), and have an etch rate of about 300 nm/min. In another example, the piranha etch solution may be more dilute and may have a volumetric concentration ratio of sulfuric acid to hydrogen peroxide to water of about 1 to about 8 to about 500 ($H_2SO_4$:$H_2O_2$:$H_2O$ is about 1:8:500), and have an etch rate of about 60 nm/min. In another example, the piranha etch solution may be further diluted and may have a volumetric concentration ratio of sulfuric acid to hydrogen peroxide to water of about 1 to about 8 to about 1,000 ($H_2SO_4$:$H_2O_2$:$H_2O$ is about 1:8:1,000), and have an etch rate of about 30 nm/min.

In another embodiment, upper portion 208 of gallium arsenide cell 210 may be exposed to a citric acid etch solution for removing gallium arsenide material disposed within the contact layer, but not within a passivation layer containing aluminum arsenide, while extending apertures 224. The citric acid etch solution may contain citric acid, ammonium hydroxide, and hydrogen peroxide. In one example, the citric acid etch solution may be formed by dissolving about 1.5 g citric acid in about 100 mL of $H_2O$, add ammonium hydroxide solution until the pH reaches about 6.2, and subsequently add about 2 mL of $H_2O_2$ in the solution. The citric acid etch solution etches gallium arsenide material but not the aluminum arsenide material, wherein $Al_xGa_{1-x}As$, and x≥about 0.2. Therefore, the citric acid etch solution may be used to etch through the contact layer containing gallium arsenide material, but stop etching at the passivation layer containing aluminum arsenide material—which could be etched by using a different etching solution, such as the above described piranha etch solution.

Alternatively, the etching of the gallium arsenide by the citric acid etch solution could be followed by etching the aluminum arsenide (but not gallium arsenide) with an iodine-containing etch solution. The iodine etch solution may contain potassium iodine, iodine, sulfuric acid, and water. In one example, the iodine etch solution may have a concentration ratio by weight of potassium iodine to iodine to water to sulfuric acid of about 100 to about 60 to about 90 to about 250 (KI:$I_2$:$H_2O$:$H_2SO_4$ is about 100:60:90:250). The iodine etch solution may be formed by combining potassium iodine, iodine, and water, then mix in equal parts of sulfuric acid as the pH is about 0.9.

Figure 4E:
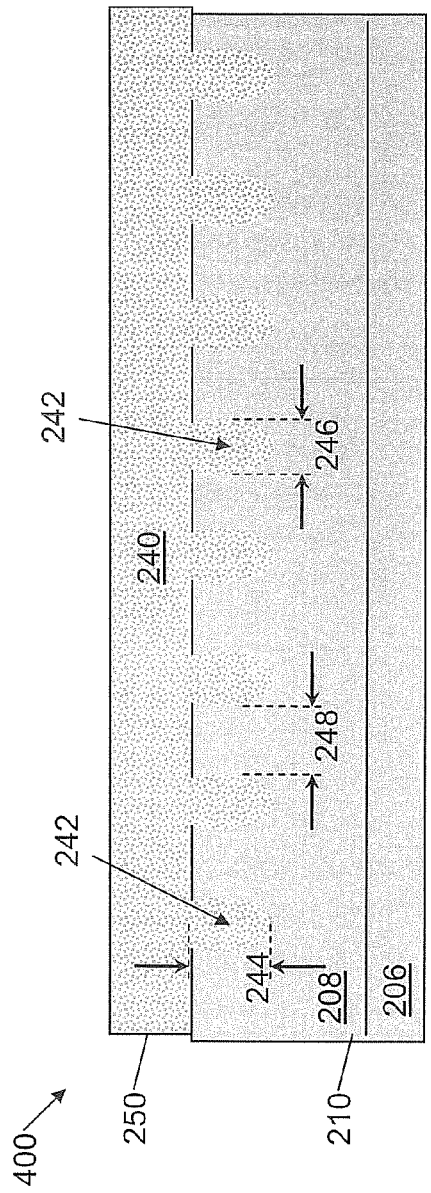

Step 340 of process 300 includes filling apertures 224 and covering any metallic islands 232 and exposed surfaces of upper portion 208 with at least one metal, while forming textured back reflector 250, as depicted in FIG. 4E. Textured back reflector 250 contains metallic reflector layer 240 and reflector protrusions 242. Reflector protrusions 242 are formed as apertures 224 are filled with the metal. Similarly, metallic reflector layer 240 is formed as metallic islands 232 and exposed surfaces of upper portion 208 are covered with the metal.

FIG. 4E depicts gallium arsenide stack 400 containing textured back reflector 250 disposed on, over, and/or extending within upper portion 208 of gallium arsenide cell 210, as described in some embodiments herein. Textured back reflector 250 contains metallic reflector layer 240 and reflector protrusions 242. Metallic reflector layer 240 may be disposed on, over, or within upper portion 208 and a p-type gallium arsenide stack, such as on or over a contact layer within upper portion 208 of gallium arsenide cell 210. Reflector protrusions 242 extend from metallic reflector layer 240 (e.g., a contact layer) and into a passivation layer (e.g., a rear window) within upper portion 208 of gallium arsenide cell 210.

Textured back reflector 250, including metallic reflector layer 240 and/or reflector protrusions 242, contains at least one metal, such as silver, gold, aluminum, nickel, copper, platinum, palladium, alloys thereof, derivatives thereof, and combinations thereof. In specific examples, metallic reflector layer 240 and/or reflector protrusions 242 contain silver, copper, or gold. Metallic reflector layer 240 may have a thickness within a range from about 15 nm to about 2,000 nm or greater. In some examples, the thickness of the metallic reflector layer may be from about 20 nm to about 750 nm, preferably, from about 50 nm to about 500 nm, and more preferably, from about 100 nm to about 250 nm. Each reflector protrusions 242 may have a diameter within a range from about 50 nm to about 500 nm, preferably, from about 100 nm to about 400 nm, and more preferably, from about 150 nm to about 300 nm. Each reflector protrusions 242 may also have a length within a range from about 30 nm to about 300 nm, such as from about 60 nm to about 160 nm. Metallic islands 232, metallic reflector layer 240, and/or protrusions 242 are in ohmic electric contact with gallium arsenide cell 210, such as upper portion 208 of gallium arsenide cell 210.

Figure 4F:
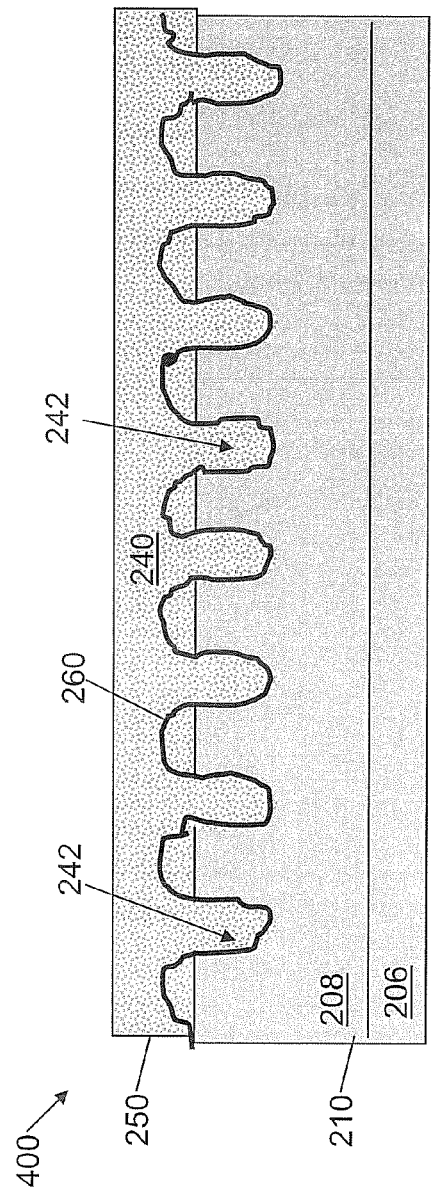
FIG. 4F depicts a gallium arsenide stack at progressive stages of forming a back reflector with an adhesion layer thereon, according to an alternative embodiment described herein.

In an alternative embodiment, as depicted in FIG. 4F, adhesion layer 260 may be deposited or formed on or over gallium arsenide material, such as upper portion 208 of gallium arsenide cell 210 and metallic islands 232 before depositing metallic reflector layer 240 and/or reflector protrusions 242. Apertures 224 are formed within upper portion 208 of gallium arsenide cell 210 as depicted in FIG. 4D. Thereafter, adhesion layer 260 may be formed on gallium arsenide stack 400 during optional step 335 in process 300. Subsequently, metallic reflector layer 240 may be disposed on or over adhesion layer 260, as depicted in FIG. 4F during step 340.

In one example, adhesion layer 260 may be disposed between gallium arsenide cell 210 or dielectric layer 220 and metallic reflector layer 240. In another example, adhesion layer 260 may be disposed between gallium arsenide cell 210 or dielectric layer 220 and reflector protrusions 242. Adhesion layer 260 may contain nickel, titanium, chromium, alloys thereof, derivatives thereof, or combinations thereof. Adhesion layer 260 may have a thickness within a range from about 1 Å to about 20 Å. Adhesion layer 260 may be deposited by PVD, ALD, or CVD techniques.

In another embodiment, gallium arsenide stack 400 containing textured back reflector 250 disposed on or over and extending into upper portion 208 of gallium arsenide cell 210, as depicted in FIG. 4E may be the same thin film stack as gallium arsenide stack 500 containing textured back reflector 540 disposed on or over and extending into p-type gallium arsenide stack 530 of gallium arsenide cell 510, as depicted in FIG. 5B.

FIGS. 5A-5D depict a gallium arsenide stack during progressive stages of fabricating another textured back reflector on a gallium arsenide cell, according to other embodiments described herein. FIG. 5A depicts gallium arsenide stack 500 containing gallium arsenide cell 510 disposed on or over sacrificial layer 516 disposed on or over buffer layer 514 disposed on or over wafer 512. In another embodiment, process 300 may be used to fabricate gallium arsenide stack 500 containing textured back reflector 540.

Wafer 512 may be a support substrate containing Group III/V materials, and may be doped with various elements. Generally wafer 512 contains gallium arsenide, alloys thereof, derivatives thereof, and may be an n-doped substrate or a p-doped substrate. In many examples, wafer 512 is a gallium arsenide substrate or a gallium arsenide alloy substrate. The gallium arsenide substrate or wafer may have a thermal expansion coefficient of about $5.73 \times 10^{-6}$ °C.$^{-1}$.

Buffer layer 514 may be a gallium arsenide buffer layer which contains gallium arsenide, alloys thereof, dopants thereof, or derivatives thereof. Buffer layer 514 may have a thickness of 3,000 nm or greater. In one example, buffer layer 514 may have a thickness within a range from about 100 nm to about 500 nm, such as about 200 nm or about 300 nm.

Sacrificial layer 516, also referred to as the ELO release layer, may contain aluminum arsenide, alloys thereof, derivatives thereof, or combinations thereof. Sacrificial layer 516 may have a thickness of about 20 nm or less. In some examples the thickness of sacrificial layer 516 may be within a range from about 1 nm to about 50 nm, such as from about 2 nm to about 40 nm, or in other examples, from about 5 nm to about 20 nm, such as from about 8 nm to about 12 nm, for example, about 10 nm.

Gallium arsenide cell 510 further contains n-type gallium arsenide stack 520 coupled with or to p-type gallium arsenide stack 530. The n-type gallium arsenide stack 520 usually contains multiples layers of various n-type doped materials. In one embodiment, n-type gallium arsenide stack 520 contains emitter layer 526 coupled with or to passivation layer 524, coupled with or to contact layer 522. In some embodiments, the n-type gallium arsenide stack 520 may have a thickness within a range from about 100 nm to about 2,000 nm. In one example, n-type gallium arsenide stack has a thickness of about 200 nm, and in another example, within a range from about 700 nm to about 1,200 nm.

Contact layer 522 may be a gallium arsenide contact layer which contains gallium arsenide, alloys thereof, dopants thereof, or derivatives thereof. In some examples, contact layer 522 contains an n-type gallium arsenide material. Contact layer 522 may have a thickness within a range from about 5 nm to about 100 nm, such as about 10 nm or about 50 nm.

Passivation layer 524, also referred to as the front window, generally contains aluminum arsenide, indium gallium phosphide, aluminum gallium phosphide, aluminum indium phosphide, alloys thereof, derivatives thereof, or combinations thereof. In many examples, passivation layer 524 contains an n-type aluminum arsenide material. In one example, passivation layer 524 contains an n-type aluminum arsenide material having the chemical formula of $Al_{0.3}Ga_{0.7}As$. Passivation layer 524 may have a thickness within a range from about 5 nm to about 100 nm, such as about 10 nm or about 50 nm.

Emitter layer 526 may contain gallium arsenide, alloys thereof, derivatives thereof, or combinations thereof. In many examples, emitter layer 526 contains an n-type gallium arsenide material. Emitter layer 526 may have a thickness within a range from about 100 nm to about 2,000 nm. In some examples the thickness of emitter layer 526 may be within a range from about 100 nm to about 600 nm, such as from about 200 nm to about 400 nm, or in other examples, from about 600 nm to about 1,200 nm, such as from about 800 nm to about 1,000 nm.

The p-type gallium arsenide layer or stack 530 usually contains multiples layers of various p-type doped materials. In one embodiment, p-type gallium arsenide stack 530 contains contact layer 536 coupled with or to passivation layer 534, coupled with or to absorber layer 532. In an alternative embodiment, absorber layer 532 is absent from p-type gallium arsenide stack 530. Therefore, p-type gallium arsenide stack 530 contains contact layer 536 coupled with or to passivation layer 534, and passivation layer 534 may be coupled with or to n-type gallium arsenide stack 520, emitter layer 526, or another layer. In some embodiments, the p-type gallium arsenide stack 530 may have a thickness within a range from about 100 nm to about 3,000 nm.

Absorber layer 532 may contain gallium arsenide, alloys thereof, derivatives thereof, or combinations thereof. In many examples, absorber layer 532 contains a p-type gallium arsenide material. In some examples, absorber layer 532 contains an n-type aluminum arsenide material. In some embodiments, absorber layer 532 may have a thickness within a range from about 1 nm to about 3,000 nm. In one embodiment, absorber layer 532 may contain a p-type gallium arsenide material and may have a thickness from about 500 nm to about 3,000 nm, such as from about 1,000 nm to about 1,500 nm. In one embodiment, absorber layer 532 may contain an n-type gallium arsenide material and may have a thickness from about 400 nm to about 2,000 nm, such as from about 700 nm to about 1,200 nm.

Passivation layer 534, also referred to as the rear window, generally contains aluminum arsenide, alloys thereof, derivatives thereof, or combinations thereof. In many examples, passivation layer 534 contains a p-type aluminum arsenide material. In one example, passivation layer 534 contains a p-type aluminum arsenide material having the chemical formula of $Al_{0.3}Ga_{0.7}As$. Passivation layer 534 may have a thickness within a range from about 25 nm to about 500 nm, such as about 50 nm or about 300 nm.

Contact layer 536 may be a p-type gallium arsenide contact layer which contains gallium arsenide, alloys thereof, dopants thereof, or derivatives thereof. In some examples, contact layer 536 contains a p-type gallium arsenide material. Contact layer 536 may have a thickness within a range from about 5 nm to about 100 nm, such as about 10 nm or about 50 nm.

FIG. 5B depicts gallium arsenide stack 500 containing textured back reflector 540 disposed on gallium arsenide cell 510, as described in some embodiments herein. Textured back reflector 540 contains metallic reflector layer 542 and reflector protrusions 544. Metallic reflector layer 542 may be disposed on or over p-type gallium arsenide stack 530, such as on or over contact layer 536. Reflector protrusions 544 extend from metallic reflector layer 542, through contact layer 536, and into passivation layer 534, such as the rear window. In another embodiment, an adhesion layer (not shown) may be formed between gallium arsenide cell 510 and textured back reflector 540.

Textured back reflector 540, including metallic reflector layer 542 and/or reflector protrusions 544, contains at least one metal, such as silver, gold, aluminum, nickel, copper, platinum, palladium, alloys thereof, derivatives thereof, and combinations thereof. In specific examples, metallic reflector layer 542 and/or reflector protrusions 544 contain silver, copper, or gold. Metallic reflector layer 542 may have a thickness within a range from about 15 nm to about 2,000 nm or greater. In some examples, the thickness of the metallic reflector layer may be from about 20 nm to about 750 nm, preferably, from about 50 nm to about 500 nm, and more preferably, from about 100 nm to about 250 nm. Each reflector protrusions 544 may have a diameter within a range from about 50 nm to about 500 nm, preferably, from about 100 nm to about 400 nm, and more preferably, from about 150 nm to about 300 nm. Each reflector protrusions 544 may also have a length within a range from about 30 nm to about 300 nm, such as from about 60 nm to about 160 nm.

FIG. 5C depicts gallium arsenide stack 500 containing support substrate 550 disposed on or over textured back reflector 540, as described in other embodiments herein. Support substrate 550 is generally translucent and may be rigid. Support substrate 550 may contain glass, quartz, crystalline material, polymeric or oligomeric material, such as plastic, derivatives thereof, or combinations thereof. In one example, support substrate 550 contains a glass. In another example, support substrate 550 contains a plastic, such as polyester or derivatives thereof.

In some embodiments, support substrate 550 may be adhered to or otherwise attached with textured back reflector 540 by metal to metal direct bonding therebetween. In one example, support substrate 550 may be adhered to or attached with textured back reflector 540 by solder, which forms a solder layer, such as layer 548. Solders may include tin containing solder, lead containing solder, tin-lead containing solder, bismuth containing solder, as well as others. Therefore, layer 548 may contain tin, lead, bismuth, alloys thereof, derivatives thereof, or combinations thereof.

In another example, support substrate 550 may be adhered to or attached with textured back reflector 540 by a metallic foil or film, which forms a metallic layer, such as layer 548. Metallic foils may include copper foil and copper alloy foils, as well as others. Therefore, layer 548 may copper or copper alloys. The metallic foil may be disposed between support substrate 550 and textured back reflector 540 and subsequently exposed to increased pressure and/or heat to form layer 548. In some examples, a copper foil may be disposed between support substrate 550 and textured back reflector 540 and exposed to a temperature within a range from about 18° C. to about 400° C. while at a pressure within a range from about 15 psi (pounds per square inch) to about 300 psi.

In other embodiments, support substrate 550 may be adhered to or otherwise attached with textured back reflector 540 by bonding therebetween with an adhesive to form an adhesive layer, such as layer 548. In one example, layer 548 may be formed from or contain a natural adhesive, a synthetic adhesive, a pressure sensitive adhesive, a hot melt adhesive, an optical adhesive and/or an ultraviolet (UV) curable adhesive, such as commercially available as Norland UV-curable optical adhesive. In some examples, the adhesive may contain a mercapto ester compound. In other examples, the adhesive may further contain a material such as butyl octyl phthalate, tetrahydrofurfuryl methacrylate, acrylate monomer, derivatives thereof, or combinations thereof.

In one example, layer 548 may be formed from adhesive that has been exposed to UV radiation during a curing process. Generally, the adhesive may be exposed to the UV radiation for a time period within a range from about 1 minute to about 10 minutes, preferably, from about 3 minutes to about 7 minutes, such as about 5 minutes. The adhesive may be cured at a temperature within a range from about 25° C. to about 75° C., such as about 50° C.

In other examples, the adhesive of layer 548 may be a silicone adhesive or may contain sodium silicate. In these examples, the adhesive may be cured for a time period within a range from about 10 hours to about 100 hours, preferably, from about 20 hours to about 60 hours, and more preferably, from about 30 hours to about 50 hours, for example, about 42 hours. The adhesive may be cured at a temperature within a range from about 25° C. to about 75° C., such as about 50° C. Also the adhesive may be cured at a pressure within a range from about 1 psi (pounds per square inch) to about 50 psi, preferably, from about 3 psi to about 25 psi, and more preferably, from about 5 psi to about 15 psi. In one example, the pressure may be about 9 psi.

FIG. 5D depicts gallium arsenide stack 500 subsequent an ELO process, such that gallium arsenide cell 510 is separated or removed from buffer layer 514 and wafer 512. Gallium arsenide stack 500 still contains gallium arsenide cell 510, as well as support substrate 550 disposed on or over textured back reflector 540, as described in other embodiments herein.

FIGS. 6A-6D depict gallium arsenide stack 600 similar to gallium arsenide stack 500 depicted in FIGS. 5A-5D, except gallium arsenide stack 600 contains dielectric layer 620 disposed between gallium arsenide cell 510 and textured back reflector 540. FIG. 6A depicts dielectric layer 620 deposited and in physical contact with gallium arsenide cell 510, such as p-type gallium arsenide stack 530, as described in one embodiment herein. In another embodiment, process 100 may be used to fabricate gallium arsenide stack 600 containing textured back reflector 540.

FIGS. 6B-6D depict gallium arsenide stack 600 containing textured back reflector 540 disposed on, over, and/or through dielectric layer 620. Textured back reflector 540 contains metallic reflector layer 542 and reflector protrusions 544. Metallic reflector layer 542 may be disposed on or over dielectric layer 620, as well as p-type gallium arsenide stack 530, such as on or over contact layer 536.

Reflector protrusions 544 extend from metallic reflector layer 542, through dielectric layer 620 and contact layer 536, and into passivation layer 534, such as the rear window.

Textured back reflector 540, including metallic reflector layer 542 and/or reflector protrusions 544, contains at least one metal, such as silver, gold, aluminum, nickel, copper, platinum, palladium, alloys thereof, derivatives thereof, and combinations thereof. In specific examples, metallic reflector layer 542 and/or reflector protrusions 544 contain silver, copper, or gold. Metallic reflector layer 542 may have a thickness within a range from about 15 nm to about 2,000 nm or greater. In some examples, the thickness of the metallic reflector layer may be from about 20 nm to about 750 nm, preferably, from about 50 nm to about 500 nm, and more preferably, from about 100 nm to about 250 nm. Each reflector protrusions 544 may have a diameter within a range from about 50 nm to about 500 nm, preferably, from about 100 nm to about 400 nm, and more preferably, from about 150 nm to about 300 nm. Each reflector protrusions 544 may also have a length within a range from about 30 nm to about 300 nm, such as from about 60 nm to about 160 nm.

In an alternative embodiment, an adhesion layer (not shown) may be deposited or formed on p-type gallium arsenide stack 530 or dielectric layer 620 before depositing metallic reflector layer 542 and/or reflector protrusions 544. In one example, the adhesion layer may be disposed between the p-type gallium arsenide stack 530 or dielectric layer 620 and metallic reflector layer 542. In another example, the adhesion layer may be disposed between p-type gallium arsenide stack 530 or dielectric layer 620 and reflector protrusions 544. The adhesion layer may contain nickel, titanium, chromium, alloys thereof, derivatives thereof, or combinations thereof. The adhesion layer may have a thickness within a range from about 1 Å to about 20 Å. The adhesion layer may be deposited by PVD, ALD, or CVD techniques.

In one embodiment, dielectric layer 620 may be formed by a vapor deposition process. The vapor deposition process may include CVD, PE-CVD, ALD, PE-ALD, and PVD processes. In some embodiments, dielectric layer 620 contains a dielectric material with a refractive index within a range from about 1 to about 3. Dielectric layer 620 may contain at least one dielectric material such as aluminum oxide, titanium oxide, tin oxide, indium oxide, zinc oxide, zinc sulfide, silicon oxide, silicon oxynitride, dopant variants thereof, derivatives thereof, or combinations thereof. In many embodiments, dielectric layer 620 contains at least one dielectric material such as silicon oxide, silicon dioxide, silicon nitride, silicon oxynitride, dopant variants thereof, derivatives thereof, or combinations thereof. In one example, dielectric layer 620 contains silicon oxide. In another example, dielectric layer 620 contains silicon oxynitride. Dielectric layer 620 may have a thickness within a range from about 10 nm to about 150 nm, preferably, from about 20 nm to about 100 nm, and more preferably, from about 30 nm to about 80 nm.

In other embodiments, dielectric layer 620 contains a dielectric material that is completely or substantially resistant to being etched when exposed to hydrofluoric acid during an ELO process. Dielectric material contained within dielectric layer 620 and which is resistant to hydrofluoric acid includes zinc sulfide, silicon nitride, derivatives thereof, or combinations thereof.

In other embodiments, a method for forming a thin film material, such as gallium arsenide stack 500, during an ELO process is provided which includes depositing or otherwise forming textured back reflector 540 on or over an epitaxial material, such as gallium arsenide cell 510, or alternatively, on or over a dielectric material disposed on gallium arsenide cell 510. Gallium arsenide cell 510 is disposed on or over a sacrificial or removable layer, such as sacrificial layer 516, on a substrate, such as wafer 512. A buffering layer, such as buffer layer 514 may be disposed between wafer 512 and sacrificial layer 516. The method provides adhering a substrate support or handle, such as substrate support 550 onto gallium arsenide cell 510, removing sacrificial layer 516 during an etching process, and peeling gallium arsenide stack 500 from buffer layer 514 while forming an etch crevice therebetween during the etching process. Gallium arsenide stack 500 contains textured back reflector 540 disposed on gallium arsenide cell 510, as depicted in FIG. 5D.

In one embodiment, sacrificial layer 516 may be exposed to a wet etch solution during an etching process of the ELO process to remove epitaxial material 630 from buffer layer 514 and wafer 512. In some embodiments, sacrificial layer 516 may be exposed to a wet etch solution during the etching process. The wet etch solution contains hydrofluoric acid and may contain a surfactant and/or a buffer. In some examples, sacrificial layer 516 may be etched at a rate of about 0.3 mm/hr or greater, preferably, about 1 mm/hr or greater, and more preferably, about 5 mm/hr or greater.

Figure 7D:
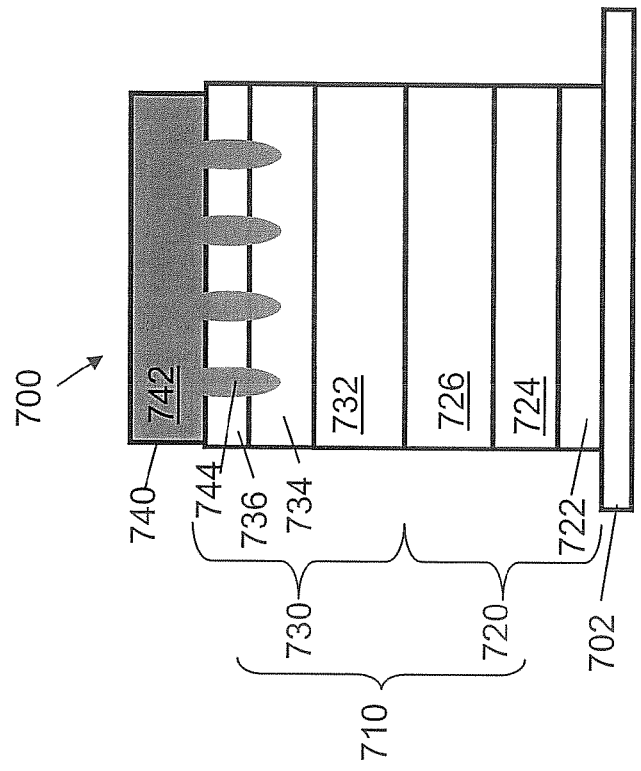

FIGS. 7A-7E depict a gallium arsenide stack during progressive stages of fabricating another textured back reflector on a gallium arsenide cell, according to other embodiments described herein. FIG. 7A depicts gallium arsenide stack 700 containing gallium arsenide cell 710 coupled with or to sacrificial layer 716 coupled with or to buffer layer 714 coupled with or to wafer 712. Gallium arsenide stack 700 containing gallium arsenide cell 710 is similar to gallium arsenide stack 500 (FIGS. 5A-5D) however the layers of gallium arsenide cell 710 are disposed in reverse order relative to the layers of gallium arsenide cell 510. Therefore, gallium arsenide cell 710 contains p-type gallium arsenide stack 730 coupled with sacrificial layer 716 and disposed between wafer 712 and n-type gallium arsenide stack 720, while gallium arsenide cell 510 contains n-type gallium arsenide stack 520 coupled with sacrificial layer 516 and disposed between wafer 512 and p-type gallium arsenide stack 530.

Wafer 712 may be a support substrate containing Group III/V materials, and may be doped with various elements. Generally wafer 712 contains gallium arsenide, alloys thereof, derivatives thereof, and may be an n-doped substrate or a p-doped substrate. In many examples, wafer 712 is a gallium arsenide substrate or a gallium arsenide alloy substrate. The gallium arsenide substrate or wafer may have a thermal expansion coefficient of about $5.73 \times 10^{-6 \circ} C.^{-1}$.

Buffer layer 714 may be a gallium arsenide buffer layer which contains gallium arsenide, alloys thereof, dopants thereof, or derivatives thereof. Buffer layer 714 may have a thickness of 3,000 nm or greater. In one example, buffer layer 714 may have a thickness within a range from about 100 nm to about 700 nm, such as about 200 nm or about 300 nm.

Sacrificial layer 716, also referred to as the ELO release layer, may contain aluminum arsenide, alloys thereof, derivatives thereof, or combinations thereof. Sacrificial layer 716 may have a thickness of about 20 nm or less. In some examples the thickness of sacrificial layer 716 may be within a range from about 1 nm to about 70 nm, such as from about 2 nm to about 40 nm, or in other examples, from about 5 nm to about 20 nm, such as from about 8 nm to about 12 nm, for example, about 10 nm.

Gallium arsenide cell 710 further contains n-type gallium arsenide stack 720 coupled with or to p-type gallium arsenide stack 730. The n-type gallium arsenide stack 720 usually contains multiples layers of various n-type doped materials. In one embodiment, n-type gallium arsenide stack 720 contains emitter layer 726 coupled with or to passivation layer 724, coupled with or to contact layer 722. In some embodiments, the n-type gallium arsenide stack 720 may have a thickness within a range from about 100 nm to about 2,000 nm. In one example, n-type gallium arsenide stack has a thickness of about 200 nm, and in another example, within a range from about 700 nm to about 1,200 nm.

Contact layer 722 may be a gallium arsenide contact layer which contains gallium arsenide, alloys thereof, dopants thereof, or derivatives thereof. In some examples, contact layer 722 contains an n-type gallium arsenide material. Contact layer 722 may have a thickness within a range from about 5 nm to about 100 nm, such as about 10 nm or about 70 nm.

Passivation layer 724, also referred to as the front window, generally contains aluminum arsenide, indium gallium phosphide, aluminum gallium phosphide, aluminum indium phosphide, alloys thereof, derivatives thereof, or combinations thereof. In many examples, passivation layer 724 contains an n-type aluminum arsenide material. In one example, passivation layer 724 contains an n-type aluminum arsenide material having the chemical formula of $Al_{0.3}Ga_{0.7}As$. Passivation layer 724 may have a thickness within a range from about 5 nm to about 100 nm, such as about 10 nm or about 70 nm.

Emitter layer 726 may contain gallium arsenide, alloys thereof, derivatives thereof, or combinations thereof. In many examples, emitter layer 726 contains an n-type gallium arsenide material. Emitter layer 726 may have a thickness within a range from about 100 nm to about 2,000 nm. In some examples the thickness of emitter layer 726 may be within a range from about 100 nm to about 600 nm, such as from about 200 nm to about 400 nm, or in other examples, from about 600 nm to about 1,200 nm, such as from about 800 nm to about 1,000 nm.

The p-type gallium arsenide layer or stack 730 usually contains multiples layers of various p-type doped materials. In one embodiment, p-type gallium arsenide stack 730 contains contact layer 736 disposed on or over passivation layer 734, disposed on or over absorber layer 732. In an alternative embodiment, absorber layer 732 is absent from p-type gallium arsenide stack 730. Therefore, p-type gallium arsenide stack 730 contains contact layer 736 disposed on or over passivation layer 734, and passivation layer 734 may be disposed on or over n-type gallium arsenide stack 720, emitter layer 726, or another layer. In some embodiments, the p-type gallium arsenide stack 730 may have a thickness within a range from about 100 nm to about 3,000 nm.

Absorber layer 732 may contain gallium arsenide, alloys thereof, derivatives thereof, or combinations thereof. In many examples, absorber layer 732 contains a p-type gallium arsenide material. In some examples, absorber layer 732 contains an n-type aluminum arsenide material. In some embodiments, absorber layer 732 may have a thickness within a range from about 1 nm to about 3,000 nm. In one embodiment, absorber layer 732 may contain a p-type gallium arsenide material and may have a thickness from about 700 nm to about 3,000 nm, such as from about 1,000 nm to about 1,700 nm. In one embodiment, absorber layer 732 may contain an n-type gallium arsenide material and may have a thickness from about 400 nm to about 2,000 nm, such as from about 700 nm to about 1,200 nm.

Passivation layer 734, also referred to as the rear window, generally contains aluminum arsenide, alloys thereof, derivatives thereof, or combinations thereof. In many examples, passivation layer 734 contains a p-type aluminum arsenide material. In one example, passivation layer 734 contains a p-type aluminum arsenide material having the chemical formula of $Al_{0.3}Ga_{0.7}As$. Passivation layer 734 may have a thickness within a range from about 25 nm to about 700 nm, such as about 70 nm or about 300 nm.

Contact layer 736 may be a p-type gallium arsenide contact layer which contains gallium arsenide, alloys thereof, dopants thereof, or derivatives thereof. In some examples, contact layer 736 contains a p-type gallium arsenide material. Contact layer 736 may have a thickness within a range from about 5 nm to about 100 nm, such as about 10 nm or about 70 nm.

FIG. 7B depicts support handle 702 coupled with or attached to gallium arsenide cell 710, as described in some embodiments herein. Support handle 702 is attached to n-type gallium arsenide stack 720 by contact layer 722.

Figure 7C:
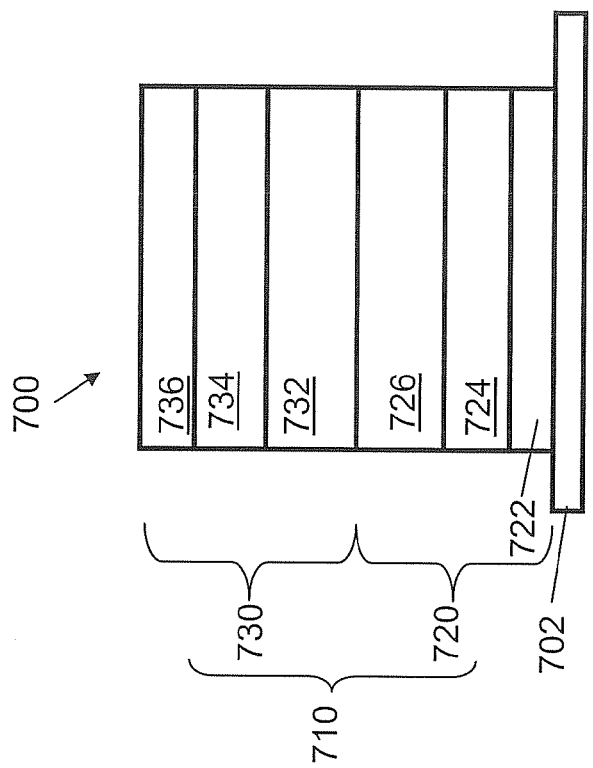

FIG. 7C depicts gallium arsenide stack 700 subsequent an ELO process, such that gallium arsenide cell 710 is separated or removed from buffer layer 714 and wafer 712. Gallium arsenide stack 700 still contains gallium arsenide cell 710, as well as support handle 702 disposed thereon, as described in other embodiments herein.

FIG. 7D depicts gallium arsenide stack 700 containing textured back reflector 740 disposed on gallium arsenide cell 710, as described in some embodiments herein. Textured back reflector 740 contains metallic reflector layer 742 and reflector protrusions 744. Metallic reflector layer 742 may be disposed on or over p-type gallium arsenide stack 730, such as on or over contact layer 736. Reflector protrusions 744 extend from metallic reflector layer 742, through contact layer 736, and into passivation layer 734, such as the rear window.

Textured back reflector 740, including metallic reflector layer 742 and/or reflector protrusions 744, contains at least one metal, such as silver, gold, aluminum, nickel, copper, platinum, palladium, alloys thereof, derivatives thereof, and combinations thereof. In specific examples, metallic reflector layer 742 and/or reflector protrusions 744 contain silver, copper, or gold. Metallic reflector layer 742 may have a thickness within a range from about 15 nm to about 2,000 nm or greater. In some examples, the thickness of metallic reflector layer 742 may have a thickness within a range from about 15 nm to about 2,000 nm or greater. In some examples, the thickness of metallic reflector layer 742 may be from about 20 nm to about 750 nm, preferably, from about 50 nm to about 500 nm, and more preferably, from about 100 nm to about 250 nm. Each reflector protrusions 744 may have a diameter within a range from about 50 nm to about 500 nm, preferably, from about 100 nm to about 400 nm, and more preferably, from about 150 nm to about 300 nm. Each reflector protrusions 744 may also have a length within a range from about 30 nm to about 300 nm, such as from about 60 nm to about 160 nm.

FIG. 7E depicts gallium arsenide stack 700 containing support substrate 750 disposed on or over textured back reflector 740, as described in other embodiments herein. Support substrate 750 is generally translucent and may be rigid. Support substrate 750 may contain glass, quartz, crystalline material, polymeric or oligomeric material, such as plastic, derivatives thereof, or combinations thereof. In one example, support substrate 750 contains a glass. In another example, support substrate 750 contains a plastic, such as polyester or derivatives thereof.

In some embodiments, support substrate 750 may be adhered to or otherwise attached with textured back reflector 740 by metal to metal direct bonding therebetween. In one example, support substrate 750 may be adhered to or attached with textured back reflector 740 by solder, which forms a solder layer, such as layer 748. Solders may include tin containing solder, lead containing solder, tin-lead containing solder, bismuth containing solder, as well as others. Therefore, layer 748 may contain tin, lead, bismuth, alloys thereof, derivatives thereof, or combinations thereof.

In another example, support substrate 750 may be adhered to or attached with textured back reflector 740 by a metallic foil or film, which forms a metallic layer, such as layer 748. Metallic foils may include copper foil and copper alloy foils, as well as others. Therefore, layer 748 may copper or copper alloys. The metallic foil may be disposed between support substrate 750 and textured back reflector 740 and subsequently exposed to increased pressure and/or heat to form layer 748. In some examples, a copper foil may be disposed between support substrate 750 and textured back reflector 740 and exposed to a temperature within a range from about 18° C. to about 400° C. while at a pressure within a range from about 15 psi (pounds per square inch) to about 300 psi.

In other embodiments, support substrate 750 may be adhered to or otherwise attached with textured back reflector 740 by bonding therebetween with an adhesive to form an adhesive layer, such as layer 748. In one example, layer 748 may be formed from or contain a natural adhesive, a synthetic adhesive, a pressure sensitive adhesive, a hot melt adhesive, an optical adhesive and/or an ultraviolet (UV) curable adhesive, such as commercially available as Norland UV-curable optical adhesive. In some examples, the adhesive may contain a mercapto ester compound. In other examples, the adhesive may further contain a material such as butyl octyl phthalate, tetrahydrofurfuryl methacrylate, acrylate monomer, derivatives thereof, or combinations thereof.

In one example, layer 748 may be formed from adhesive that has been exposed to UV radiation during a curing process. Generally, the adhesive may be exposed to the UV radiation for a time period within a range from about 1 minute to about 10 minutes, preferably, from about 3 minutes to about 7 minutes, such as about 5 minutes. The adhesive may be cured at a temperature within a range from about 25° C. to about 75° C., such as about 70° C.

In other examples, the adhesive of layer 748 may be a silicone adhesive or may contain sodium silicate. In these examples, the adhesive may be cured for a time period within a range from about 10 hours to about 100 hours, preferably, from about 20 hours to about 60 hours, and more preferably, from about 30 hours to about 70 hours, for example, about 42 hours. The adhesive may be cured at a temperature within a range from about 25° C. to about 75° C., such as about 70° C. Also the adhesive may be cured at a pressure within a range from about 1 psi (pounds per square inch) to about 70 psi, preferably, from about 3 psi to about 25 psi, and more preferably, from about 5 psi to about 15 psi. In one example, the pressure may be about 9 psi.

In another embodiment, process 300 may be used to fabricate gallium arsenide stack 700 containing textured back reflector 740.

FIG. 8 depict gallium arsenide stack 800 similar to gallium arsenide stack 700 depicted in FIGS. 7A-7E except gallium arsenide stack 800 contains dielectric layer 820 disposed between gallium arsenide cell 710 and textured back reflector 740. FIG. 8 depicts dielectric layer 820 deposited and in physical contact with gallium arsenide cell 710, such as p-type gallium arsenide stack 730, as described in one embodiment herein. In another embodiment, process 100 may be used to fabricate gallium arsenide stack 800 containing textured back reflector 740.

In alternative embodiments, gallium arsenide cells 510 and 710 may contain one layer, but usually contains multiple layers of epitaxial materials, such as gallium arsenide, n-doped gallium arsenide, p-doped gallium arsenide, aluminum arsenide, n-doped aluminum arsenide, p-doped aluminum arsenide, aluminum indium phosphide, aluminum gallium phosphide, aluminum arsenide, indium gallium phosphide, alloys thereof, n-doped variants, p-doped variants, derivatives thereof, or combinations thereof. Gallium arsenide cells 510 and 710 may have a rectangular geometry, a square geometry, or other geometries. In some examples, gallium arsenide cells 510 and 710 contain a layer having gallium arsenide and another layer having aluminum arsenide. In another example, gallium arsenide cells 510 and 710 contain a gallium arsenide buffer layer, an aluminum arsenide passivation layer, and a gallium arsenide active layer.

Figure 9:
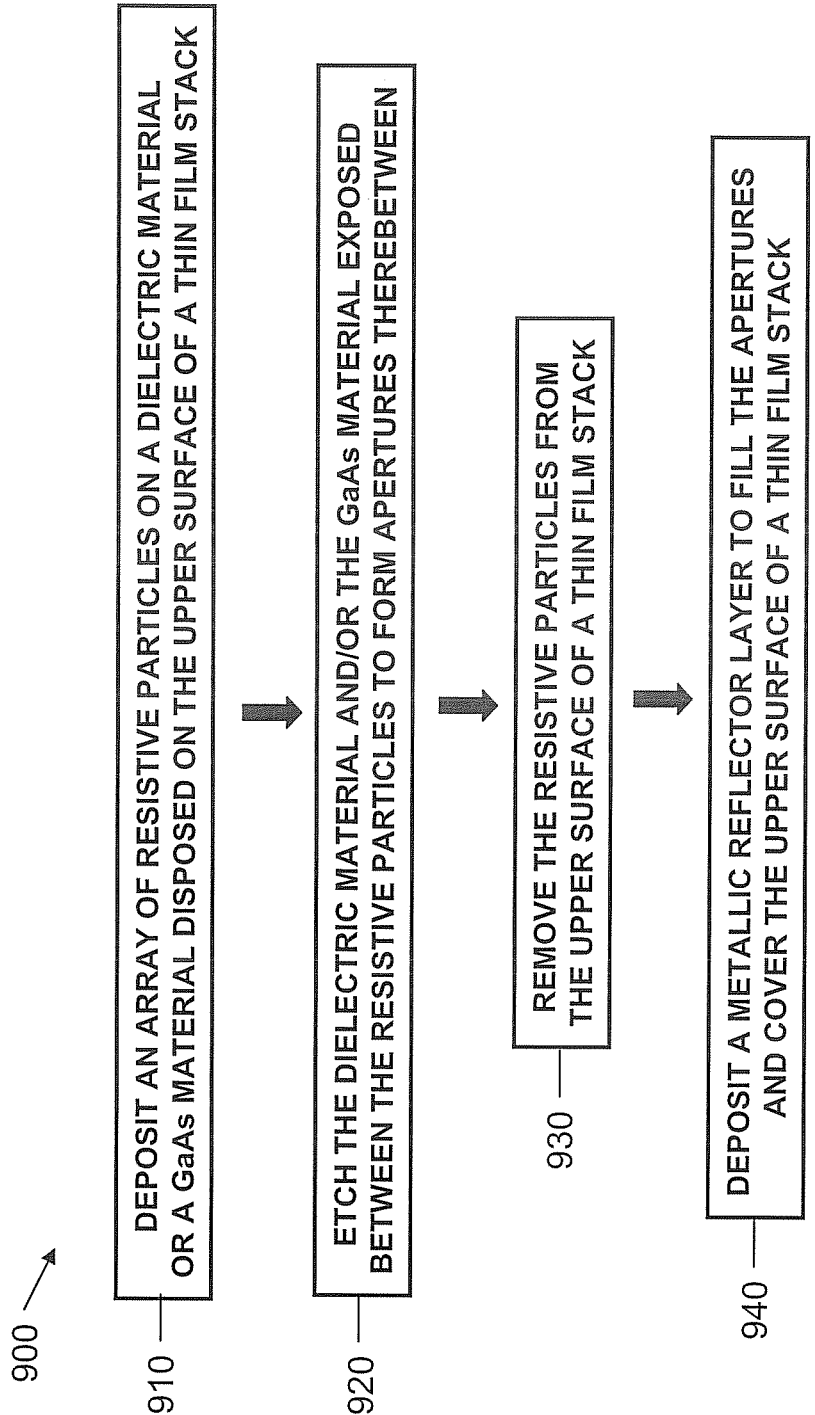
FIG. 9 illustrates a flow chart depicting a process for forming another back reflector according to other embodiments described herein.

FIG. 9 illustrates a flow chart depicting process 900 for forming another back reflector according to other embodiments described herein. In step 910 of process 900, an array of resistive particles is disposed on the upper surface of a thin film stack, such as on a dielectric material or a gallium arsenide material disposed thereon. The resistive particles may be randomly distributed across the upper surface of the stack, such as in a close packed space alignment. The resistive particles may be dip-coated, spin-coated, or otherwise dry-coated on to the upper surface from an emulsion or suspension containing a liquid carrier.

The resistive particles may contain a polymeric material, oligomeric material, or derivatives thereof. In some examples, the resistive particles contain polystyrene, polysiloxanes, or derivatives thereof. In other embodiments, the resistive particles may be formed by a spin-on process, such as spin-on glass (SOG) or other materials. SOG materials may contain a mixture of silicon oxide and dopants (e.g., boron or phosphorous). The resistive particles may be beads or nanoparticles which have a particle size within a range from about 0.005 µm to about 5 µm, preferably, from about 0.01 µm to about 1 µm, and more preferably, from about 0.05 µm to about 0.5 µm. Resistive particles which are useful in embodiments described herein may be SPHERO™ polystyrene particles, such as PP-008-010 and PP025-10, commercially available from Spherotech, Inc. of Lake Forest, Ill. In one example, polystyrene particles are suspended at a concentration of about 5.0 w/v and have a nominal particle size within a range from about 0.05 µm to about 0.1 µm. In another example, polystyrene particles are suspended at a concentration of about 5.0 w/v and have a nominal particle size within a range from about 0.2 µm to about 0.3 µm.

In step 920, the exposed surfaces of the dielectric material and/or the gallium arsenide material between the resistive particles are etched to form apertures therebetween.

In step 930, the resistive particles are removed from the upper surface of the thin film stack—such as the dielectric or gallium arsenide material.

In step 940, a metallic reflector layer is deposited within the apertures and on the upper surface in order to fill the apertures and to cover the dielectric or gallium arsenide material. The filled apertures form the reflector protrusions of the metallic reflector.

While the foregoing is directed to embodiments of the invention, other and further embodiments of the invention may be devised without departing from the basic scope thereof, and the scope thereof is determined by the claims that follow.

The invention claimed is:

1. A method for forming a gallium arsenide cell, comprising:
   depositing a p-type gallium arsenide stack above an n-type gallium arsenide stack;
   depositing a dielectric layer on the p-type gallium arsenide stack;
   depositing a metallic layer on the dielectric layer;
   forming an array of metallic islands from the metallic layer during an annealing process;
   removing, between the metallic islands, portions of the dielectric layer and portions of the p-type gallium arsenide stack to form a plurality of apertures that extend through the dielectric layer and into the p-type gallium arsenide stack; and
   depositing a metallic reflector layer of a textured metallic back reflector on the dielectric layer and over the array of metallic islands, the textured metallic back reflector including a plurality of reflector protrusions extending from the metallic reflector layer, between the metallic islands, into respective apertures from the plurality of apertures to fill the respective aperture,
   wherein the metallic islands comprise a metal selected from the group consisting of silver, gold, nickel, copper, platinum, palladium, alloys thereof, derivatives thereof, and combinations thereof.

2. The method of claim 1, wherein the metallic reflector layer comprises a metal selected from the group consisting of silver, gold, aluminum, nickel, copper, platinum, palladium, alloys thereof, derivatives thereof, and combinations thereof.

3. The method of claim 1, further comprising depositing an adhesion layer over the p-type gallium arsenide stack and metallic islands prior to depositing the metallic reflector layer.

4. The method of claim 3, wherein the adhesion layer comprises a metal selected from the group consisting of nickel, titanium, chromium, alloys thereof, derivatives thereof, and combinations thereof.

5. The method of claim 3, wherein the adhesion layer is deposited by a vapor deposition process selected from the group consisting of CVD, ALD, or PVD.

6. The method of claim 1, further comprising depositing an adhesion layer within each of the plurality of apertures prior to depositing the metallic reflector layer.

7. The method of claim 6, wherein the adhesion layer comprises a metal selected from the group consisting of nickel, titanium, chromium, alloys thereof, derivatives thereof, and combinations thereof.

8. The method of claim 6, wherein the adhesion layer is deposited by a vapor deposition process selected from the group consisting of CVD, ALD, or PVD.

9. The method of claim 1, wherein the annealing process further comprises:
   exposing the metallic layer to nitrogen gas within a processing system; and
   heating the metallic layer to a temperature of about 200° C.

10. The method of claim 1, wherein the p-type gallium arsenide stack is disposed on or over a sacrificial layer, and the sacrificial layer is disposed on or over a substrate.

11. The method of claim 10, wherein the sacrificial layer comprises aluminum arsenide.

12. The method of claim 10, wherein the sacrificial layer is removed and the p-type gallium arsenide stack and the substrate are separated during an epitaxial lift off process.

13. The method of claim 12, wherein the epitaxial lift off process occurs prior to the annealing process.

14. The method of claim 12, wherein the epitaxial lift off process occurs subsequent to the annealing process.

15. The method of claim 1, wherein the metallic layer is deposited by a vapor deposition process.

16. The method of claim 1, wherein the metallic reflector layer is deposited by a vapor deposition process.

17. The method of claim 1, wherein the p-type gallium arsenide stack includes a layer containing gallium arsenide, alloys thereof, dopants thereof, or derivatives thereof.

18. The method of claim 1, wherein the p-type gallium arsenide stack includes a layer containing aluminum arsenide, alloys thereof, derivatives thereof, or combinations thereof.

19. The method of claim 1, wherein the n-type gallium arsenide stack includes a layer containing aluminum indium gallium phosphide, aluminum gallium phosphide, aluminum indium phosphide, alloys thereof, derivatives thereof, or combinations thereof.

20. The method of claim 1, wherein the dielectric layer comprises at least one dielectric material selected from the group consisting of tin oxide, indium oxide, zinc oxide, zinc sulfide, derivatives thereof and combinations thereof.

21. A gallium arsenide cell comprising:
   a p-type gallium arsenide stack disposed above an n-type gallium arsenide stack;
   a dielectric layer disposed on the p-type gallium arsenide stack;
   an array of metallic islands formed from a metallic layer disposed on the dielectric layer, wherein a plurality of apertures that extend through the dielectric layer and into the p-type gallium arsenide stack are formed by removal, between the metallic islands, of portions of the dielectric layer and portions of the p-type gallium arsenide stack; and
   a textured metallic back reflector having a metallic reflector layer disposed on the dielectric layer and over the array of metallic islands, the textured metallic back reflector including a plurality of reflector protrusions extending from the metallic reflector layer, between the metallic islands, into respective apertures from the plurality of apertures to fill the respective aperture,
   wherein the dielectric layer comprises at least one dielectric material selected from the group consisting of tin oxide, indium oxide, zinc oxide, zinc sulfide, derivatives thereof and combinations thereof, and
   wherein the metallic islands comprise a metal selected from the group consisting of silver, gold, nickel, copper, platinum, palladium, alloys thereof, derivatives thereof, and combinations thereof.

22. The cell of claim 21, wherein the metallic reflector layer comprises a metal selected from the group consisting of silver, gold, aluminum, nickel, copper, platinum, palladium, alloys thereof, derivatives thereof, and combinations thereof.

23. The cell of claim 21, wherein the plurality of reflector protrusions comprise a metal selected from the group consisting of silver, gold, aluminum, nickel, copper, platinum, palladium, alloys thereof, derivatives thereof, and combinations thereof.

24. The cell of claim 21, wherein the metallic reflector layer and the plurality of reflector protrusions comprise the same material.

25. The cell of claim 21, further comprising an adhesion layer disposed between the dielectric layer and the metallic reflector layer, wherein the adhesion layer covers each metallic island of the array of metallic islands formed on the dielectric layer.

26. The cell of claim 25, wherein the adhesion layer comprises a metal selected from the group consisting of nickel, titanium, chromium, alloys thereof, derivatives thereof, and combinations thereof.

27. The cell of claim 21, further comprising an adhesion layer disposed between the p-type gallium arsenide stack and the plurality of reflector protrusions, wherein the adhesion layer covers each aperture of the plurality of apertures.

28. The cell of claim 27, wherein the adhesion layer comprises a metal selected from the group consisting of nickel, titanium, chromium, alloys thereof, derivatives thereof, and combinations thereof.

29. The cell of claim 21, wherein the p-type gallium arsenide stack includes a layer containing gallium arsenide, alloys thereof, dopants thereof, or derivatives thereof.

30. The cell of claim 21, wherein the p-type gallium arsenide stack includes a layer containing aluminum arsenide, alloys thereof, derivatives thereof, or combinations thereof.

31. The cell of claim 21, wherein the n-type gallium arsenide stack includes a layer containing aluminum indium gallium phosphide, aluminum gallium phosphide, aluminum indium phosphide, alloys thereof, derivatives thereof, or combinations thereof.

32. A gallium arsenide cell comprising:
a p-type gallium arsenide stack disposed above an n-type gallium arsenide stack;
a dielectric layer disposed on the p-type gallium arsenide stack;
an array of metallic islands formed from a metallic layer disposed on the dielectric layer, wherein a plurality of apertures that extend through the dielectric layer and into the p-type gallium arsenide stack are formed by removal, between the metallic islands, of portions of the dielectric layer and portions of the p-type gallium arsenide stack; and
a textured metallic back reflector having a metallic reflector layer disposed on the dielectric layer and over the array of metallic islands, the textured metallic back reflector including a plurality of reflector protrusions extending from the metallic reflector layer, between the metallic islands, into respective apertures from the plurality of apertures to fill the respective aperture,
wherein the metallic islands comprise a metal selected from the group consisting of silver, gold, nickel, copper, platinum, palladium, alloys thereof, derivatives thereof, and combinations thereof.

33. The cell of claim 32, wherein the dielectric layer comprises at least one dielectric material selected from the group consisting of silicon oxide, silicon dioxide, silicon nitride, silicon oxynitride, derivatives thereof, and combinations thereof.

34. The cell of claim 32, wherein the p-type gallium arsenide stack includes a layer containing gallium arsenide, alloys thereof, dopants thereof, or derivatives thereof.

35. The cell of claim 32, wherein the p-type gallium arsenide stack includes a layer containing aluminum arsenide, alloys thereof, derivatives thereof, or combinations thereof.

36. The cell of claim 32, wherein the n-type gallium arsenide stack includes a layer containing aluminum indium gallium phosphide, aluminum gallium phosphide, aluminum indium phosphide, alloys thereof, derivatives thereof, or combinations thereof.

37. A gallium arsenide cell comprising:
a p-type gallium arsenide stack disposed above an n-type gallium arsenide stack;
an array of metallic islands formed from a metallic layer disposed on the p-type gallium arsenide stack, wherein a plurality of apertures that extend into the p-type gallium arsenide stack are formed by removal, between the metallic islands, of portions of the p-type gallium arsenide stack; and
a textured metallic back reflector having a metallic reflector layer disposed on the p-type gallium arsenide stack and over the array of metallic islands, the textured metallic back reflector including a plurality of reflector protrusions extending from the metallic reflector layer, between the metallic islands, into respective apertures from the plurality of apertures to fill the respective aperture,
wherein the metallic islands comprise a metal selected from the group consisting of silver, gold, nickel, copper, platinum, palladium, alloys thereof, derivatives thereof, and combinations thereof.

38. The cell of claim 37, wherein the p-type gallium arsenide stack includes a layer containing gallium arsenide, alloys thereof, dopants thereof, or derivatives thereof.

39. The cell of claim 37, wherein the p-type gallium arsenide stack includes a layer containing aluminum arsenide, alloys thereof, derivatives thereof, or combinations thereof.

40. The cell of claim 37, wherein the n-type gallium arsenide stack includes a layer containing aluminum indium gallium phosphide, aluminum gallium phosphide, aluminum indium phosphide, alloys thereof, derivatives thereof, or combinations thereof.

* * * * *